(12) United States Patent
Aruga et al.

(10) Patent No.: US 8,436,687 B2
(45) Date of Patent: May 7, 2013

(54) OSCILLATING APPARATUS

(75) Inventors: Kenta Aruga, Yokohama (JP); Suguru Tachibana, Yokohama (JP); Koji Okada, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/974,996

(22) Filed: Dec. 21, 2010

(65) Prior Publication Data

US 2011/0156825 A1 Jun. 30, 2011

(30) Foreign Application Priority Data

Dec. 24, 2009 (JP) ................................. 2009-293178

(51) Int. Cl.
*H03K 3/03* (2006.01)
(52) U.S. Cl.
USPC ............. 331/57; 331/135; 331/143; 331/176; 331/185
(58) Field of Classification Search ............... 331/57, 331/111, 135, 143, 176, 185; 327/131, 132
See application file for complete search history.

(56) References Cited

U.S. PATENT DOCUMENTS

| | | | |
|---|---|---|---|
| 6,356,161 B1 * | 3/2002 | Nolan et al. | 331/176 |
| 6,462,625 B2 | 10/2002 | Kim | |
| 6,515,551 B1 * | 2/2003 | Mar et al. | 331/111 |
| 7,068,116 B2 | 6/2006 | Kato et al. | |
| 2002/0000889 A1 * | 1/2002 | Kim | 331/143 |
| 2003/0184395 A1 * | 10/2003 | Nagatomo | 331/135 |
| 2005/0168293 A1 * | 8/2005 | Kato et al. | 331/36 C |

FOREIGN PATENT DOCUMENTS

| | | |
|---|---|---|
| JP | 53-060149 A | 5/1978 |
| JP | 63-182909 A | 7/1988 |
| JP | 63-304702 A | 12/1988 |
| JP | 07-202646 A | 8/1995 |
| JP | 2002-33644 A | 1/2002 |
| JP | 2005-217762 A | 8/2005 |

\* cited by examiner

*Primary Examiner* — Joseph Chang
*Assistant Examiner* — Jeffrey Shin
(74) *Attorney, Agent, or Firm* — Fujitsu Patent Center

(57) ABSTRACT

An oscillating apparatus includes: a transfer gate including a P-channel transistor and a N-channel transistor; a first inverter for inverting an output signal of the transfer gate and outputting the inverted output signal of the transfer gate; a second inverter for inverting the output signal of the first inverter and outputting the inverted output signal of the first inverter; a third inverter for inverting the output signal of the first inverter and outputting the inverted output signal of the first inverter; a fourth inverter for inverting the output signal of the third inverter and outputting the inverted output signal of the third inverter to an input-terminal of the transfer gate; a first capacitor connected between an output-terminal of the transfer gate and an output-terminal of the second inverter; and a second capacitor connected between the output-terminal of the transfer gate and a reference potential node.

6 Claims, 10 Drawing Sheets

US 8,436,687 B2

OSCILLATING APPARATUS

CROSS-REFERENCE TO RELATED APPLICATION

This application is based upon and claims the benefit of priority from the prior Japanese Patent Application No. 2009-293178 filed on Dec. 24, 2009, the entire contents of which are incorporated herein by reference.

FIELD

This embodiments discussed herein are related to an oscillating apparatus.

BACKGROUND

Some integrated circuits such as a micro-controller have a built-in CR oscillating circuit (or ring oscillator) on a chip, and a clock signal for the micro-controller is supplied from the built-in oscillating circuit. This is because in the case of an oscillating circuit using a crystal resonator or ceramic resonator, the start-up time which means the time from power is turned on until the output frequency of the oscillating circuit stabilizes is long, and it is sometimes desirable to use a CR oscillating circuit, a ring oscillator, or the like having a shorter start-up time as a clock source, even with a decrease in the accuracy of oscillation frequency. More specifically, for applications that frequently repeat starting and stopping of an oscillating circuit, a waiting time occurs at the start-up of the oscillating circuit, and it is sometimes desirable from the viewpoint of overall system performance improvement to reduce the power consumption during this waiting time. Also, an on-chip oscillating circuit is sometimes used for the purpose of cost reduction as well.

FIG. 1 is a circuit diagram of a CR oscillating circuit. In the CR oscillating circuit, IV1, IV2, and IV3 each denote an inverter, C1 and C2 each denote a capacitor, R1 denotes a resistor, ND1 to ND4 each denote a node within the oscillating circuit, and GND denotes a ground potential (0 V). The waveform of each of the nodes ND1, ND2, and ND3 is the output waveform (rectangular wave) of a CMOS circuit. The waveform of the node ND4 is such that owing to capacitive coupling between the nodes ND2 and ND4, at the time of a potential change of the node ND2, the potential of the node ND4 changes in the same direction as the node ND2, and is thereafter gradually charged/discharged by the potential of the node ND3 and the resistor R1.

FIG. 2 is a circuit diagram of another oscillating circuit. In FIG. 2, IV1 and IV4 each denote an inverter, C1 and C2 each denote a capacitor, NMn (n is an integer) denotes an N-channel MOS transistor, and PMn (n is an integer) denotes a P-channel MOS transistor. In FIG. 2, Vdd denotes a positive power supply voltage (for example, 3 V), GND denotes a ground potential (0 V), NDn (n is an integer) denotes a node within the oscillating circuit, VBGR denotes a constant voltage (for example, 2 V) generated from a band gap circuit, PB denotes the bias potential of a P-channel MOS transistor PM1, and NB denotes the bias potential of an N-channel MOS transistor NM2.

In the circuit illustrated in FIG. 2, nodes and elements corresponding to those of the circuit illustrated in FIG. 1 are assigned the same symbols to make their correspondence clear. In the circuit illustrated in FIG. 2, a node ND5 at one end of the capacitor C1 is driven by an inverter (transistors PM3 and NM3) with the constant voltage VBGR as the power supply, thereby controlling the signal amplitude of the node ND5 to be constant irrespective of temperature. In order to achieve a design in which frequency is independent of temperature, the circuit is so configured as to make the current flowing through transistors PM2 and NM1 constant independent of temperature. The bias potentials PB and NB are such potentials that make the current flowing through the transistors PM2 and NM1 constant.

The bias generation circuitry for generating the bias potentials PB and NB is all integrated on a semiconductor chip, and the circuit configuration as described below is adopted to generate a temperature-independent current. To generate a constant current, the potential generated by flowing a current through a resistor, and a reference voltage are made to coincide with each other by feedback control. By taking the temperature dependence of an on-chip resistor into account, temperature dependence is imparted to the reference voltage. The circuit is designed so that by imparting a positive temperature dependence to the reference voltage such that as the resistance becomes larger with a rise in temperature, the reference voltage also becomes larger with temperature, the temperature dependence of the resistor is cancelled out by the temperature dependence of the reference voltage, thereby ensuring that current is independent of temperature. The above-mentioned circuit realizes an oscillating circuit whose oscillation frequency is constant with respect to temperature and power supply voltage.

Although the circuit illustrated in FIG. 1 succeeds in achieving an oscillation frequency that is independent of power supply voltage by use of the capacitors C1 and C2 and the resistor R1, the circuit has a drawback in that if the resistor R1 is dependent on temperature, it is difficult to suppress fluctuation of oscillation frequency. In the case where the resistor R1 is integrated into a semiconductor chip, for example, it is practically difficult to reduce the temperature dependence of the resistor R1 below a certain level. Also, when the values of the resistor R1 and capacitors C1 and C2 fluctuate owing to manufacturing variations, so does oscillation frequency. That is, the circuit illustrated in FIG. 1 has the following problems: when the values of the resistor R1 and capacitors C1 and C2 fluctuate owing to manufacturing variations, oscillation frequency also fluctuates; and when the value of the resistor R1 varies owing to temperature fluctuation, oscillation frequency fluctuates.

The circuit illustrated in FIG. 2 aims to cancel out the temperature dependence of a resistor by the temperature dependence of a pre-designed built-in reference voltage, and generate the bias potentials PB and NB for charging/discharging the capacitors C1 and C2 at constant current, thereby mitigating temperature variation of oscillation frequency. However, an error is present in the actual output potential VBGR of a reference voltage generation circuit. This error also causes the temperature dependence of the potential VBGR to become slightly positive or negative depending on each individual circuit manufactured. Even more ideally, even when the circuit is configured so as to make the current flowing through the transistors PM2 and NM1 constant independent of temperature, because an error is also present in this portion, the temperature dependence of the charging/discharging current for the capacitors C1 and C2 does not become exactly the same as a designed value, either. Furthermore, the delay time of the inverters IV1 and IV4 is also dependent on temperature and each individual circuit manufactured, and thus becomes the cause of an error in the temperature characteristics of oscillation frequency.

In the circuit illustrated in FIG. 2, even if it is attempted to control the current that charges the capacitors C1 and C2 to be constant by means of the bias potentials PB and NB, when the node ND4 changes from low level to high level, the transistor NM1 turns OFF, so the drain potential of the transistor NM2 becomes the ground potential GND. Since a parasitic capacitance is present at the drain of the transistor NM2, when the node ND4 changes from high level to low level, the discharging current for the node ND4 does not become exactly the same as the current set by the bias potential NB. An extra electrical charge equivalent to the parasitic capacitance at the drain of the transistor NM2 being charged from the ground potential GND to a given potential is discharged from the node ND4. Likewise, the parasitic capacitance at the drain of the transistor PM1 also becomes the cause of an error in the setting of current.

Japanese Laid-open Patent Publication No. 63-304702 discloses an oscillating circuit configured so that, in a ring oscillator in which a plurality of stages of gates are serially connected and the gate output of the last stage is fed back to the gate input of the first stage to thereby excite oscillation, a transfer gate is inserted in between adjacent gates, and the transfer gate is connected to a control potential that may be made variable in an analog manner.

SUMMARY

According to an aspect of the embodiment, an oscillating apparatus includes: a transfer gate including a P-channel transistor and a N-channel transistor; a first inverter for inverting an output signal of the transfer gate and outputting the inverted output signal of the transfer gate; a second inverter for inverting the output signal of the first inverter and outputting the inverted output signal of the first inverter; a third inverter for inverting the output signal of the first inverter and outputting the inverted output signal of the first inverter, the third inverter being connected to a power supply potential node wire different from a power supply potential node wire for the second inverter; a fourth inverter for inverting the output signal of the third inverter and outputting the inverted output signal of the third inverter to an input-terminal of the transfer gate; a first capacitor connected between an output-terminal of the transfer gate and an output-terminal of the second inverter; and a second capacitor connected between the output-terminal of the transfer gate and a reference potential node, wherein the transfer gate outputs a signal at the input-terminal from the output-terminal in accordance with a gate voltage of each of the P-channel transistor and the N-channel transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
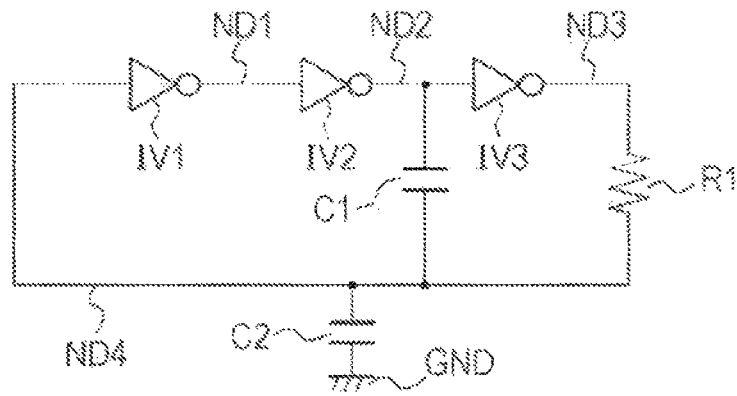
FIG. 1 is a circuit diagram of a CR oscillating circuit.
Figure 2:
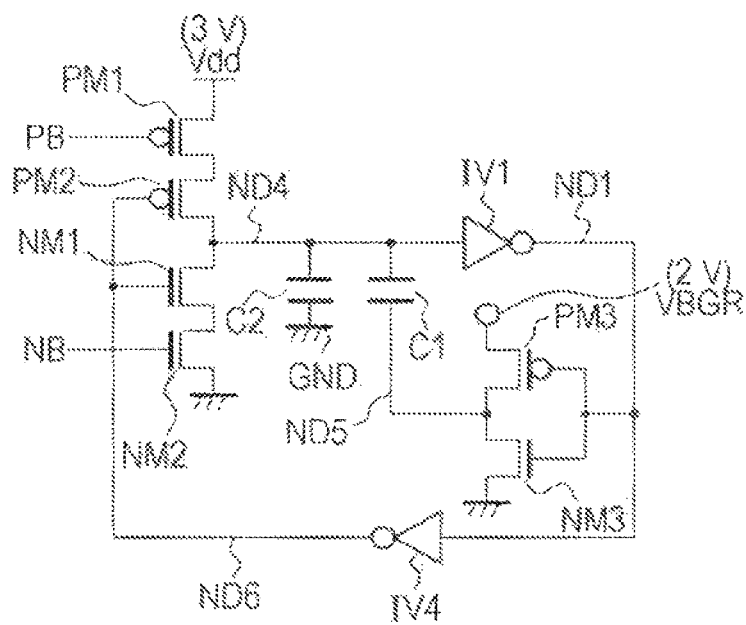
FIG. 2 is a circuit diagram of another oscillating circuit.
Figure 3:
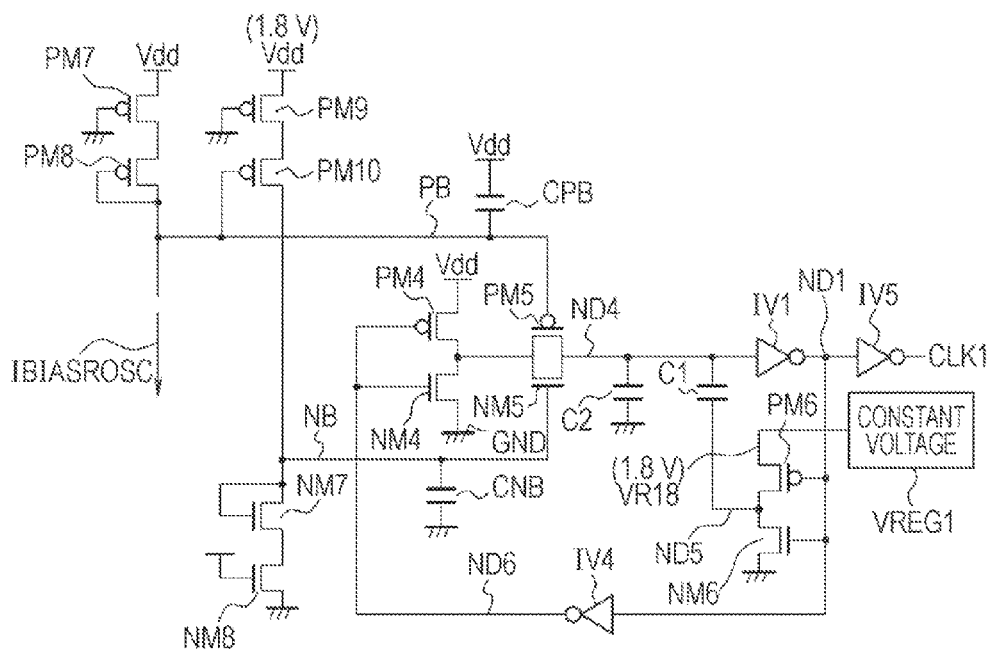
FIG. 3 is a circuit diagram illustrating an example of the configuration of a CR oscillating circuit of an embodiment.
Figure 4:
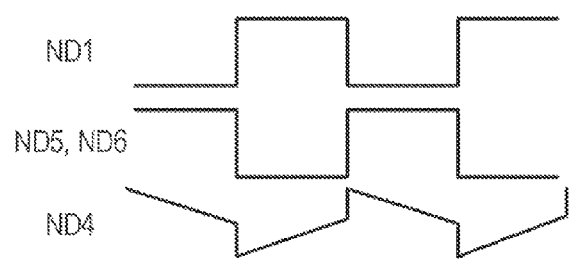
FIG. 4 is a diagram illustrating an example of waveforms in various parts of the circuit illustrated in FIG. 3.

FIG. 3 is a circuit diagram illustrating an example of the configuration of a CR oscillating circuit of an embodiment. FIG. 4 is a diagram illustrating an example of waveforms in various parts of the circuit illustrated in FIG. 3. The circuit illustrated in FIG. 3 will be described with reference to FIG. 4. In FIG. 3, NMn (n is an integer) denotes an N-channel MOS transistor, PMn (n is an integer) denotes a P-channel MOS transistor, Vdd denotes a positive power supply potential (for example, 1.8 V), VR18 denotes a positive power supply potential (for example, 1.8 V), and GND denotes a reference potential (ground potential: 0 V). In FIG. 3, NDn (n is an alphanumeric character) denotes a node within the oscillating circuit, IV1, IV4, and IV5 each denote an inverter, C1, C2, CNB, and CPB each denote a capacitor, IBIASROSC denotes a bias current for the circuit illustrated in FIG. 3, PB denotes the gate bias potential of a transistor PM5, NB denotes the gate bias potential of a transistor NM5, CLK1 denotes a clock signal, and VREG1 denotes a circuit that generates the power supply potential VR18. The inverters IV1, IV4, and IV5 each output a signal that is the logical inversion of an input signal. In FIG. 3, elements having the same functions as those in the circuits illustrated in FIGS. 1 and 2, and the corresponding nodes are assigned the same symbols to indicate their correspondence. The bias current IBIASROSC will be described with reference to the circuit illustrated in FIG. 11 described later.

A transistor PM7 has a source connected to the node of the power supply potential Vdd, and a gate connected to the node of the reference potential GND. A transistor PM8 has a source connected to the drain of the transistor PM7, and a gate and a drain that are connected to each other. The bias current IBIASROSC is the drain current of each of the transistors PM7 and PM8. A transistor PM9 has a source connected to the node of the power supply potential Vdd, and a gate connected to the node of the reference potential GND. A transistor PM10 has a source connected to the drain of the transistor PM9, and a gate connected to the drain of the transistor PM8. A transistor NM7 has a drain and a gate that are connected to the drain of the transistor PM10. A transistor NM8 has a drain connected to the source of the transistor NM7, a gate connected to the node of the power supply potential Vdd, and a source connected to the node of the reference potential GND. The capacitor CPB is connected between the node of the power supply potential Vdd and the drain of the transistor PM8. The capacitor CNB is connected between the drain of the transistor NM7 and the node of the reference potential GND.

A transistor PM4 has a source connected to the node of the power supply potential Vdd, and a gate connected to the output terminal of the inverter IV4. A transistor NM4 has a drain connected to the drain of the transistor PM4, a gate connected to the output terminal of the inverter IV4, and a source connected to the node of the reference potential GND. The transistors PM4 and NM4 constitute an inverter. A transistor PM5 has a source connected to the drain of the transistor PM4, a gate connected to the drain of the transistor PM8, and a drain connected to the input terminal of the inverter IV1. A transistor NM5 has a source connected to the drain of the transistor PM4, a gate connected to the drain of the transistor NM7, and a drain connected to the input terminal of the inverter IV1. The transistors PM5 and NM5 constitute a transfer gate. The bias potential PB is the gate potential of the transistor PM5. The bias potential NB is the gate potential of the transistor NM5. For example, the bias potential PB is 1 V, and the bias potential NB is 0.8 V.

A node ND4 is connected to the input terminal of the inverter IV1. The capacitor C2 is connected between the node ND4 and the node of the reference potential GND. A node ND1 is connected to the output terminal of the inverter IV1. The inverter IV5 performs logical inversion of the signal of the node ND1, and outputs the clock signal CLK1. The constant voltage generation circuit VREG1 generates the power supply potential VR18 (for example, 1.8 V). A transistor PM6 has a source connected to the node of the power supply potential VR18, a gate connected to the node ND1, and a drain connected to a node ND5. A transistor NM6 has a drain connected to the node ND5, a gate connected to the node ND1, and a source connected to the node of the reference potential GND. The transistors PM6 and NM6 constitute an inverter. The capacitor C1 is connected between the nodes ND4 and ND5. The inverter IV4 has an input terminal connected to the node ND1, and an output terminal connected to a node ND6.

In the circuit illustrated in FIG. 2, even if it is attempted to control the current that charges the capacitors C1 and C2 to be constant by means of the bias potentials PB and NB, when the node ND4 changes from low level to high level, a transistor NM1 turns OFF, so the drain potential of a transistor NM2 becomes the ground potential GND. Since a parasitic capacitance is present at the drain of the transistor NM2, when the node ND4 changes from high level to low level, the discharging current for the node ND4 does not become exactly the same as the current set by the bias potential NB. An extra electrical charge equivalent to the parasitic capacitance at the drain of the transistor NM2 being charged from the ground potential GND to a given potential is discharged from the node ND4. Likewise, the parasitic capacitance at the drain of a transistor PM1 also becomes the cause of an error in the setting of current.

On the other hand, in the circuit illustrated in FIG. 3, if the speed of the change in the output of each of the transistors PM4 and NM4 is sufficiently high, the charging current for the parasitic capacitance at the source (node connected to each of the transistors PM4 and NM4) of each of the transistors PM5 and NM5 is not supplied to the node ND4. By adopting the circuit configuration illustrated in FIG. 3 in this way, the accuracy of setting of current by the bias potentials PB and NB may be improved.

As illustrated in FIG. 3, an element that restricts current supplied to a load serves as a CMOS transfer gate (transistors PM5 and NM5). For example, even in the state when the transistor PM4 is ON and the transistor NM4 is OFF, not only does the transistor PM5 supply current to the node ND4, but depending on the potential of the node ND4, there is a possibility that the transistor NM5 also turns ON.

The circuit illustrated in FIG. 3 is configured so that when charging the node ND4, current is supplied from only the transistor PM5. By driving the node ND5 at the constant potential VR18, the signal amplitude of the node ND4 becomes constant independent of the power source potential Vdd. By setting C2:C1 as 2:1, for example, the signal amplitude of the node ND4 may be set to approximately ⅔ of the potential VR18. By making the signal amplitude of the node ND4 small, the withstand voltage of the inverter IV1 may be made low.

While the potentials Vdd and VR18 are both constant at 1.8 V, as will be described later with reference to FIG. 4, the power supply potential supplied to the elements PM4, NM4, IV1, IV5, IV4, and the like is set to the potential Vdd, and only the power supply potential supplied to the transistors PM6 and NM6 is set as the potential VR18.

Figure 5:
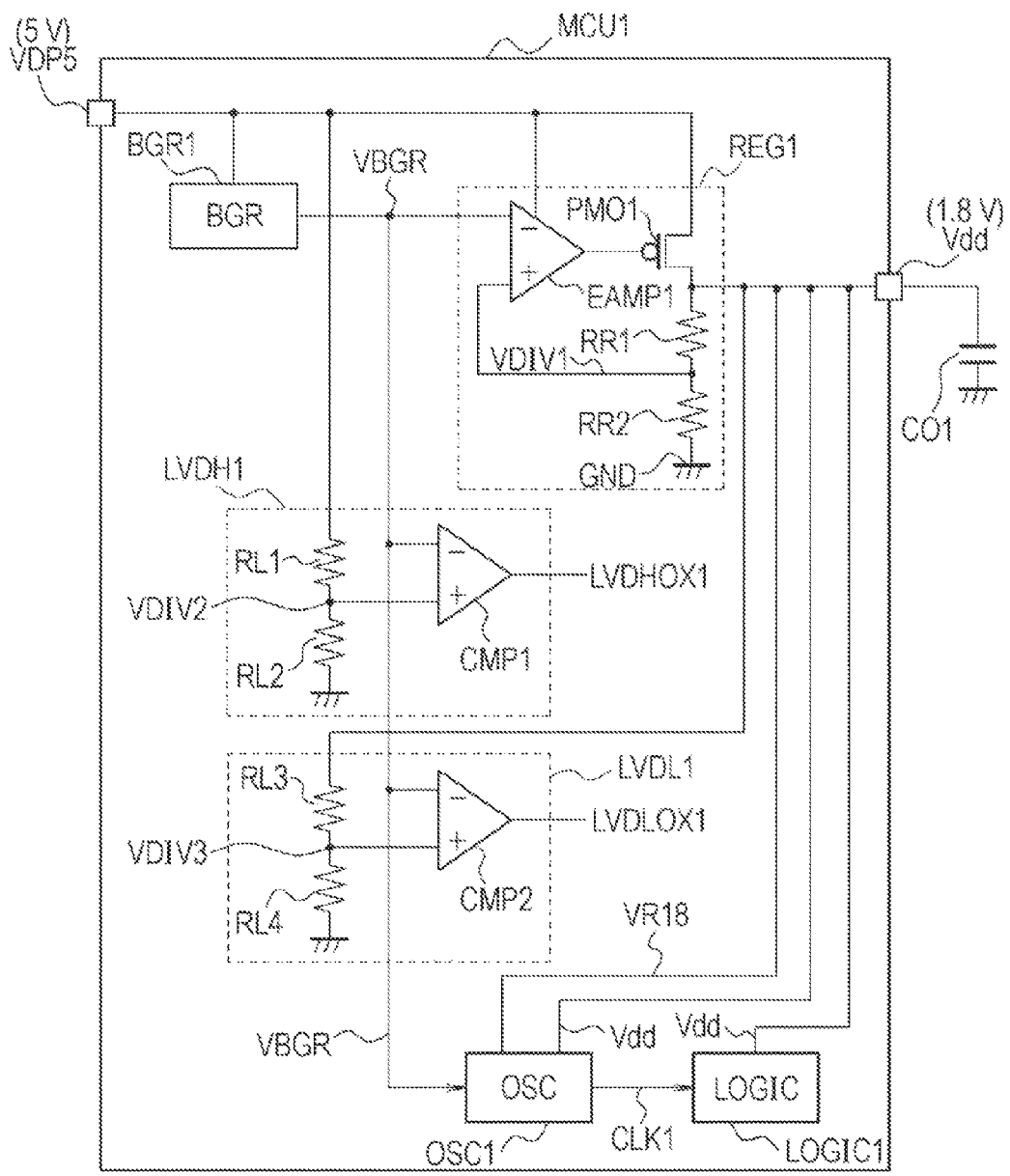
FIG. 5 is a diagram illustrating an example of the configuration of a micro-controller (oscillating apparatus) mounted with the CR oscillating circuit illustrated in FIG. 3.

The reason for using separate power supply potentials in this way is to minimize fluctuation of the potential VR18 caused by voltage fluctuation due to power supply current of the inverters IV1, IV5, and IV4, and the like. The intention is to suppress fluctuation of the potential VR18 as much as possible by using separate wires for the potentials VR18 and Vdd as illustrated in FIG. 5.

Supposing that the ratio between the capacitors C1 and C2 is 1:1, when the logic threshold of the inverter IV1 is 0.9 V, as the node ND1 changes from low level to high level, the potential of the node ND5 changes from 1.8 V to 0V. The potential of the node ND4 changes from 0.9 V to 0 V. The node ND4 is charged at constant current in the range of 0 V to 0.9 V, and when the potential of the node ND4 exceeds 0.9 V, and the potential of the node ND1 changes from high level to low level, the potential of the node ND4 changes from 0.9 V to 1.8 V. The node ND4 is discharged at constant current from 1.8 V to 0.9 V, resulting in the waveform as illustrated in FIG. 4. Fluctuation of oscillation frequency may be thus prevented.

By setting the capacitors C2:C1 not to 1:1 but, for example, 2:1, the low level of the node ND4 may be set to a potential higher than 0 V. Also, the high level of the node ND4 may be set to a potential lower than 1.8 V. Thus, the inverter IV1 with a low withstand voltage may be used.

The bias potentials PB and NB in FIG. 3 are each set to such a potential that a predetermined current flows when the source potential of each of the transistors PM5 and NM5 is substantially the power supply potential (1.8 V or 0 V). When the node ND4 is charged, the potential of the node ND4 may be made higher than 0 V. This allows a design such that when charging the node ND4 by the transistor PM5, the transistor NM5 remains OFF, thereby preventing the transistor NM5 from affecting the charging current.

When discharging the node ND4, the transistor NM4 turns ON, and discharges the node ND4 at a current set by the transistor NM5. By designing the relationship between the capacitors C1 and C2 such that the high level of the node ND4 is a potential lower than the power supply potential Vdd, the transistor PM5 may be designed so as to remain OFF when discharging the node ND4 by the transistor NM5.

The transfer gate including the P-channel transistor PM5 and the N-channel transistor NM5 outputs a signal at the input terminal from the output terminal in accordance with the gate voltage of each of the P-channel transistor PM5 and the N-channel transistor NM5. The inverter IV1 takes a signal from the output terminal of the transfer gate PM5, NM5 as input, and outputs the logically inverted signal of the inputted signal. The inverter including the transistors PM6 and NM6 takes a signal from the output terminal of the inverter IV1 as input, and outputs the logically inverted signal of the inputted signal. The inverter including the transistors PM4 and NM4 takes the logically inverted signal of the output signal of the inverter IV1 as input, and outputs the logically inverted signal of the inputted signal to the input terminal of the transfer gate PM5, NM5. The capacitor C1 is connected between the output terminal of the transfer gate PM5, NM5 and the output terminal of the inverter PM6, NM6. The capacitor C2 is connected between the output terminal of the transfer gate PM5, NM5 and the reference potential node. The inverter IV4 is connected to a power supply potential wire Vdd different from a power supply potential wire VR18 for the inverter PM6, NM6. The inverter IV4 takes a signal at the output terminal of the inverter IV1 as input, and outputs the logically inverted signal of the inputted signal to the input terminal of the inverter PM4, NM4. As described above, the circuit illustrated in FIG. 3 makes it possible to improve the accuracy of setting of charging/discharging current.

FIG. 5 is a diagram illustrating an example of the configuration of a micro-controller (oscillating apparatus) mounted with the CR oscillating circuit illustrated in FIG. 3. A CR oscillating circuit OSC1 has the CR oscillating circuit illustrated in FIG. 3, and its details will be described later with reference to FIG. 8. MCU1 denotes a micro-controller (oscillating apparatus) mounted with the CR oscillating circuit OSC1, VDP5 denotes a positive power supply potential (for example, 5 V), Vdd denotes a positive power supply potential (for example, 1.8 V) generated by a regulator REG1, and GND denotes a reference potential (ground potential: 0 V).

BGR1 denotes a band gap circuit, REG1 denotes a regulator including an error amplifier EAMP1, an output transistor PMO1, and voltage divider resistors RR1 and RR2, LVDH1 denotes a low voltage detection circuit for monitoring the power supply potential VDP5 of 5 V, and LVDL1 denotes a low voltage detection circuit for monitoring the power supply potential Vdd of 1.8 V. OSC1 denotes a CR oscillating circuit (for example, the circuit illustrated in FIG. 3), LOGIC1 denotes a logic circuit that operates at internal potential Vdd, EAMP1 denotes an error amplifier of the regulator REG1, and PMO1 denotes an output P-channel MOS transistor of the regulator REG1. RR1 and RR2 each denote a voltage divider resistor that divides the power supply potential Vdd, VDIV1 denotes a voltage divided by the resistors RR1 and RR2, RL1 and RL2 each denote a resistor that divides the power supply potential VDP5, and VDIV2 denotes a voltage divided by the resistors RL1 and RL2. LVDHOX1 denotes the output voltage of the low voltage detection circuit LVDH1, RL3 and RL4 each denote a resistor that divides the power supply potential Vdd, VDIV3 denotes a voltage divided by the resistors RL3 and RL4, and LVDLOX1 denotes the output voltage of the low voltage detection circuit LVDL1. VBGR denotes the output band gap voltage of the band gap circuit BGR1, CO1 denotes a capacitor that stabilizes the power supply potential Vdd, CMP1 and CMP2 each denote a comparator circuit, CLK1 denotes the output clock signal of the CR oscillating circuit OSC1, and VR18 denotes the power supply potential of the CR oscillating circuit OSC1. The power supply potential Vdd of the CR oscillating circuit OSC1 corresponds to the power supply potential Vdd illustrated in FIG. 3. In FIG. 5, elements having the same functions as those in the circuit illustrated in FIG. 3, and the corresponding nodes are assigned the same symbols to indicate their correspondence.

In the micro-controller MCU1, the power supply potential VDP5 supplied from the outside is maintained at, for example, 5 V, and the internal potentials Vdd and VR18 determined by the withstand voltages of internal transistors are generated by the built-in regulator REG1. FIG. 5 illustrates an example in which the external power supply potential VDP5 is 5 V, and the potentials Vdd and VR18 generated by the built-in regulator REG1 are 1.8 V.

In order to supply a constant potential Vdd of 1.8 V even when the power supply potential VDP5 fluctuates, a reference voltage VBGR is generated by the band bap circuit BGR1. On the basis of the reference voltage VBGR, the regulator REG1 generates the potentials Vdd and VR18 of 1.8 V, and supplies the potentials to the internal circuits LVDL1, OSC1, and LOGIC1. The low voltage detection circuit LVDH1 monitors the power supply potential VDP5, and when the power supply potential VDP5 becomes lower than a predetermined potential, sets the output voltage LVDHOX1 to low level. The low voltage detection circuit LVDL1 monitors the power supply potential Vdd, and when the power supply potential Vdd becomes lower than a predetermined potential, sets the output voltage LVDLOX1 to low level.

The logic circuit LOGIC1 operates at the power supply potential Vdd, and is supplied with the clock signal CLK1 from the CR oscillating circuit OSC1. The CR oscillating circuit OSC1 determines a bias current on the basis of the output potential Vdd of the regulator REG1 and, for example, the band gap voltage VBGR, and generates the clock signal CLK1.

It is desirable for the regulator REG1, the low voltage detection circuits LVDH1 and LVDL1, and the CR oscillating circuit OSC1 mounted to the micro-controller MCU1 to use a band gap circuit or a circuit similar to a band gap circuit in order to generate a reference potential or reference current. In such a case, as illustrated in FIG. 5, by employing a circuit configuration in which functions that may be made common is implemented as a common band gap circuit BGR1 in advance, and lacking functions are added on the basis of this, overlapping functions need not be provided as separate circuits. This enables a reduction in effective circuit area.

Next, operation of each of the circuits illustrated in FIG. 5 will be briefly described. The description given below assumes that the band gap voltage VBGR is 1.2 V. The regulator REG1 generates the power supply potential Vdd of 1.8 V from the voltage VBGR of 1.2 V. The error amplifier EAMP1 and the transistor PMO1 form a negative feedback circuit, and the power supply potential Vdd is determined so as to make the band gap voltage VBGR and the voltage VDIV1 coincide with each other. For example, if the resistors RR1 and RR2 are designed so that the ratio between their resistances is 1:2, when the power supply potential Vdd is 1.8 V, the divided voltage VDIV1 is 1.2 V, so the power supply potential Vdd may be set to 1.8 V on the basis of the band gap voltage VBGR. The capacitor CO1 functions as a stabilizing capacitor for suppressing fluctuation of the power supply potential Vdd when the load current fluctuates abruptly.

The low voltage detection circuit LVDH1 functions as a circuit for detecting a drop in the power supply potential VDP5 when, for example, the power supply potential VDP5 becomes lower than 2.4 V. By setting the ratio between the resistances of the resistors RL1 and RL2 to 1:1 in advance, when the power supply potential VDP5 becomes lower than 2.4 V, the voltage VDIV2 becomes lower than the band gap voltage VBGR. By detecting this by the comparator circuit CMP1, for example, the output voltage LVDHOX1 may be set to low level. As described above, when the band gap circuit BGR1 used by the regulator REG1, and the band gap circuit BGR1 used by the low voltage detection circuit LVDH1 are made common, this means that the circuits that need to be added to implement the low voltage detection circuit function are, for example, only the resistors RL1 and RL2 and the comparator circuit CMP1, thereby enabling a reduction in effective circuit area.

The low voltage detection circuit LVDL1 functions as a circuit for detecting a drop in the power supply potential Vdd when, for example, the power supply potential Vdd becomes lower than 1.4 V. By setting the ratio between the resistances of the resistors RL3 and RL4 to 1:6 in advance, when the power supply potential Vdd becomes lower than 1.4 V, the voltage VDIV3 becomes lower than the band gap voltage VBGR. By detecting this by the comparator circuit CMP2, for example, the output voltage LVDLOX1 may be set to low level. When the band gap circuit BGR1 used by the regulator REG1 and the low voltage detection circuit LVDH1, and the band gap circuit BGR1 used by the low voltage detection circuit LVDL1 are made common, this means that the circuits that need to be added to implement the low voltage detection circuit function for the power supply potential Vdd are, for example, only the resistors RL3 and RL4 and the comparator circuit CMP2, thereby enabling a reduction in effective circuit area.

As in the case of the lower voltage detection circuits LVDH1 and LVDL1, for the CR oscillating circuit OSC1 as well, circuit function portions that are common to those of the regulator REG1 or the like are shared, thereby enabling a reduction in effective area in the case when the CR oscillating circuit OSC1 and the regulator REG1 are mounted.

FIG. 5 illustrates a case in which the bias current for the CR oscillating circuit OSC1 is generated on the basis of the band gap voltage VBGR. Details of the circuit will be described later with reference to other drawings.

Figure 6:
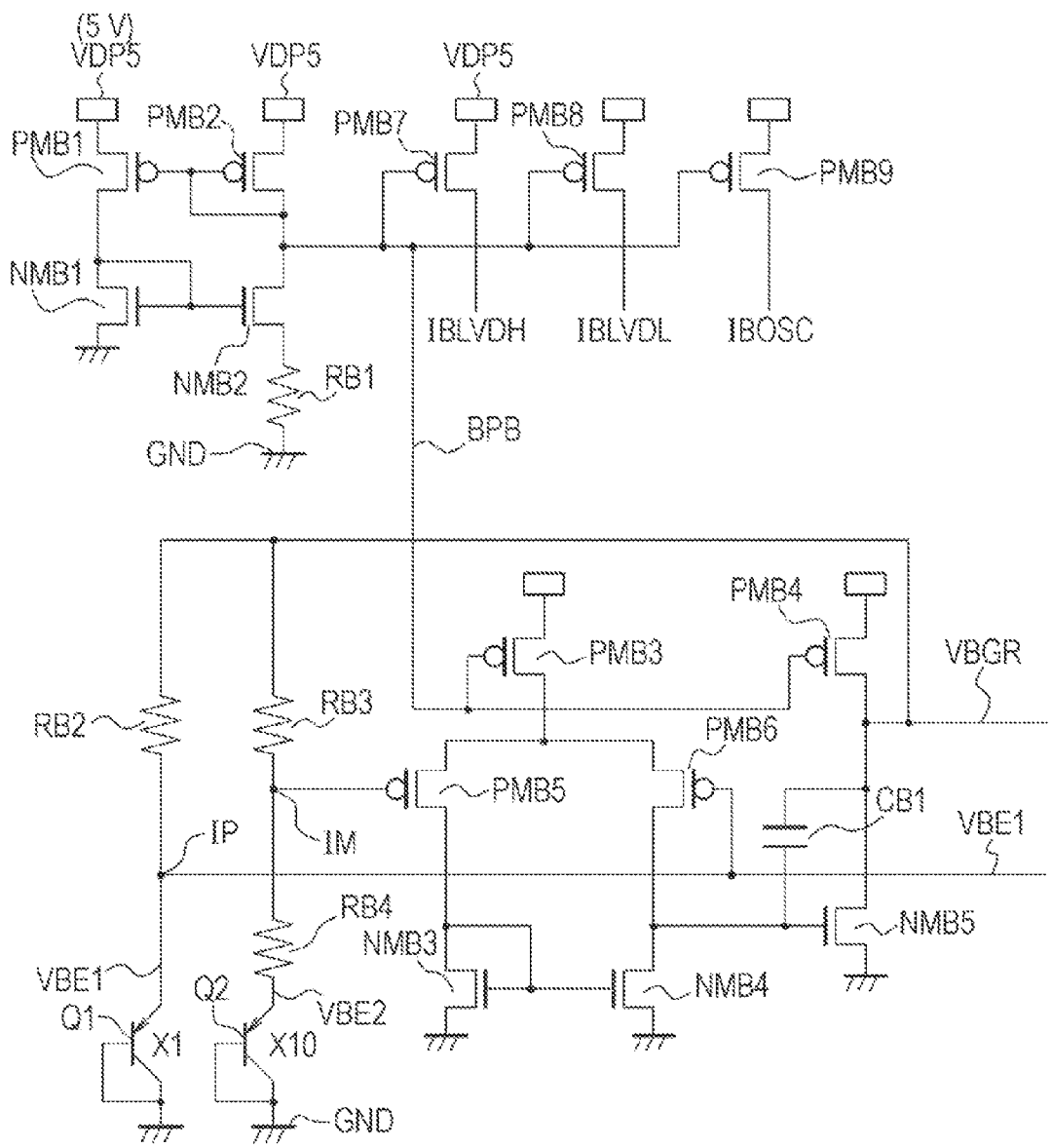
FIG. 6 is a circuit diagram illustrating an example of the configuration of the band gap circuit illustrated in FIG. 5.

FIG. 6 is a circuit diagram illustrating an example of the configuration of the band gap circuit BGR1 illustrated in FIG. 5. NMBn (n is an integer) denotes an N-channel MOS transistor, PMBn (n is an integer) denotes a P-channel MOS transistor, VDP5 denotes a positive power supply potential (for example, 5 V), and GND denotes a reference potential (ground potential: 0 V). CB1 denotes a capacitor, RB1, RB2, RB3, and RB4 each denote a resistor, Q1 and Q2 each denote a PNP transistor, BPB denotes a bias potential, IBLVDH denotes a bias current supplied to the low voltage detection circuit LVDH1 illustrated in FIG. 5, IBLVDL denotes a bias current supplied to the low voltage detection circuit LVDL1 illustrated in FIG. 5, and IBOSC denotes a bias current supplied to the CR oscillating circuit OSC1 illustrated in FIG. 5. VBE1 denotes the emitter potential of the transistor Q1, VBE2 denotes the emitter potential of the transistor Q2, IP and IM each denote a node given for the purpose of explanation, and VGBR denotes an output band gap voltage. The emitter potential VBE1 is used in circuits illustrated in FIGS. 8, 10, 14, and 15 described later.

In FIG. 6, nodes corresponding to those in the circuits illustrated in FIGS. 3 and 5 are assigned the same symbols to indicate their correspondence. It is supposed that the numbers indicating multiplication factors attached to the transistors Q1 and Q2 in FIG. 6 indicate the relationship between the relative sizes of the respective transistors Q1 and Q2. In the following, likewise, it is supposed that the numbers indicating multiplication factors attached to PNP transistors indicate the relationship between the relative sizes of the respective transistors.

Since the power supply potential VDP5 applied to the transistors PMB1 to PMB9 and the transistors NMB1 to NMB5 is 5 V, the withstand voltage of these transistors needs to be 5 V or more. Although these transistors are different from the transistors for the internal power supply potentials Vdd and VR18 (1.8 V) used in the circuit illustrated in FIG. 3 in gate length and gate oxide film thickness, for the sake of brevity, and because the correspondence is apparent from the power supply potential, the circuit is expressed using the same transistor symbols as the transistor symbols used in the circuit illustrated in FIG. 3. In the description that follows, unless otherwise specified, it is supposed that transistors corresponding to the power supply potential are used.

A circuit formed by the transistors PMB1, PMB2, NMB1, and NMB2, and the resistor RB1 generates a bias current. Since the circuit in this portion is a general one, its detailed description is omitted. Also, for the simplicity of the drawing, elements such as a start-up circuit and a power-down element are not illustrated. By designing the transistors NMB1 and NMB2 to which the same gate voltage is applied in such a way that the size (gate width) of the transistor NMB2 is large relative to that of the transistor NMB1, the bias current may be designed on the basis of the difference in gate voltage for flowing the same current, and the resistor RB1. The bias potential BPB is determined as a potential at which this bias current flows.

The transistors PMB5, PMB6, PMB3, NMB3, NMB4, NMB5, and PMB4 function as an operational amplifier circuit for by performing feedback control so as to make the potential of the node IP and the potential of the node IM coincide with each other, thereby generating the bang gap voltage VBGR. The transistor PMB3 functions as a current source for the operational amplifier circuit. The operational amplifier formed by the transistors PMB5, PMB6, PMB3, NMB3, NMB4, NMB5, and PMB4 itself is configured as a general two-stage operational amplifier circuit. The capacitor CB1 functions as a phase compensation capacitor for the operational amplifier.

When the potentials of the nodes IP and IM coincide with each other, equal potential differences are applied to the resistors RB2 and RB3, so currents determined by the ratio between the resistors RB2 and RB3 flow through the transistors Q1 and Q2. Since the ratio between the emitter sizes of the transistors Q1 and Q2 is designed to be, for example, 1:10, in accordance with the ratio between the resistors RB2 and RB3, the current densities of the transistors Q1 and Q2 are determined. In accordance with the ratio between the current densities, the difference between the respective emitter potentials VBE1 and VBE2 of the transistors Q1 and Q2 is determined. The difference between the emitter potentials VBE1 and VBE2 is applied to the resistor RB4, and currents flowing through the transistors Q1 and Q2 are determined. The emitter potential VBE1 exhibits a negative dependence on absolute temperature, and the currents flowing through the transistors Q1 and Q2 are positively proportional to absolute temperature. Herein below, CTAT denotes a negative dependence on absolute temperature, and PTAT denotes a positive dependence on absolute temperature.

By selecting the values of the resistors RB2 and RB3 in such a way that the band gap voltage VBGR is approximately 1.2 V, the band gap voltage VBGR becomes constant independent of temperature. The transistors PMB7, PMB8, and PMB9 are provided so that simultaneously with generating the bias potential BPB by the bias circuit in order to determine the current of the current source for the band gap circuit BGR1, the bias potential BPB may be also used as the bias current for the low voltage detection circuits LVDH1 and LVDL1, and the CR oscillating circuit OSC1. This eliminates the redundant need to provide a bias circuit formed by the transistors PMB1, PMB2, NMB1, and NMB2, and the resistor RB1 in each of the low voltage detection circuits LVDH1 and LVDL1, the CR oscillating circuit OSC1, and the like.

Also, as will be described later, when not only the band gap voltage VBGR but also the emitter potential VBE1 of the transistor Q1 is supplied to the CR oscillating circuit OSC1 in advance, this is convenient in generating a reference current for the CR oscillating circuit OSC1.

The band gap circuit BGR1 has the PNP transistor Q1 whose base and collector are each connected to the reference potential node, the PNP transistor Q2 whose base and collector are each connected to the reference potential node, and the resistor RB4 whose one end is connected to the emitter of the PNP transistor Q2. The band gap circuit BGR1 generates the band gap voltage VBGR by controlling the potential IM at the other end of the resistor RB4 and the emitter potential VBE1 of the PNP transistor Q1 so as to be equal.

Figure 7:
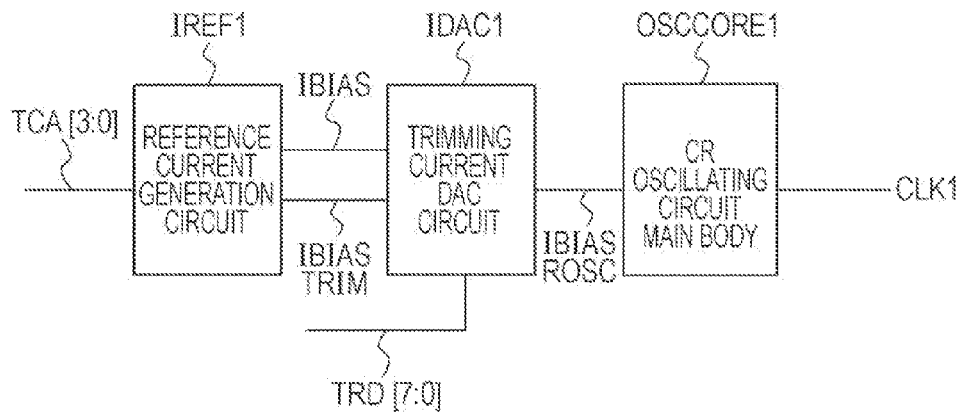
FIG. 7 is a block diagram illustrating an example of the configuration of the CR oscillating circuit illustrated in FIG. 5.

FIG. 7 is a block diagram illustrating an example of the configuration of the CR oscillating circuit OSC1 illustrated in FIG. 5. IREF1 denotes a reference current generation circuit of the CR oscillating circuit OSC1, IDAC1 denotes a trimming current digital/analog conversion (DAC) circuit for regulating oscillation frequency, OSCCORE1 denotes the oscillating circuit main body of the CR oscillating circuit OSC1, TCA [3:0] denotes, for example, a 4-bit signal for regulating the temperature dependence of frequency, and TRD [7:0] denotes, for example, an 8-bit signal for regulating oscillation frequency. IBIAS and IBIASTRIM each denote a reference current generated by the reference current generation circuit IREF1, IBIASROSC denotes a bias current for the CR oscillating circuit main body OSCCORE1 supplied from the trimming current DAC circuit IDAC1, and CLK1 denotes the output clock signal of the CR oscillating circuit OSC1.

The reference current generation circuit IREF1 generates the reference currents IBIAS and IBIASTRIM on the basis of the band gap voltage VBGR, the emitter potential VBE1, and the like illustrated in FIG. 6. The trimming current DAC circuit IDAC1 supplies the bias current IBIASROSC to the CR oscillating circuit main body OSCCORE1 on the basis of the reference currents IBIAS and IBIASTRIM. The CR oscillating circuit main body OSCCORE1 is configured like, for example, the CR oscillating circuit illustrated in FIG. 3. In FIG. 7, nodes corresponding to those in the circuits illustrated in FIGS. 3 and 5 are assigned the same symbols to indicate their correspondence.

The temperature-dependence regulation signal TCA [3:0] functions as a signal for regulating the temperature dependence of the reference currents IBIAS and IBIASTRIM. The frequency regulation signal TRD [7:0] functions as a signal for regulating the absolute value of the bias current IBIASROSC in order to regulate the absolute value of frequency.

Figure 8:
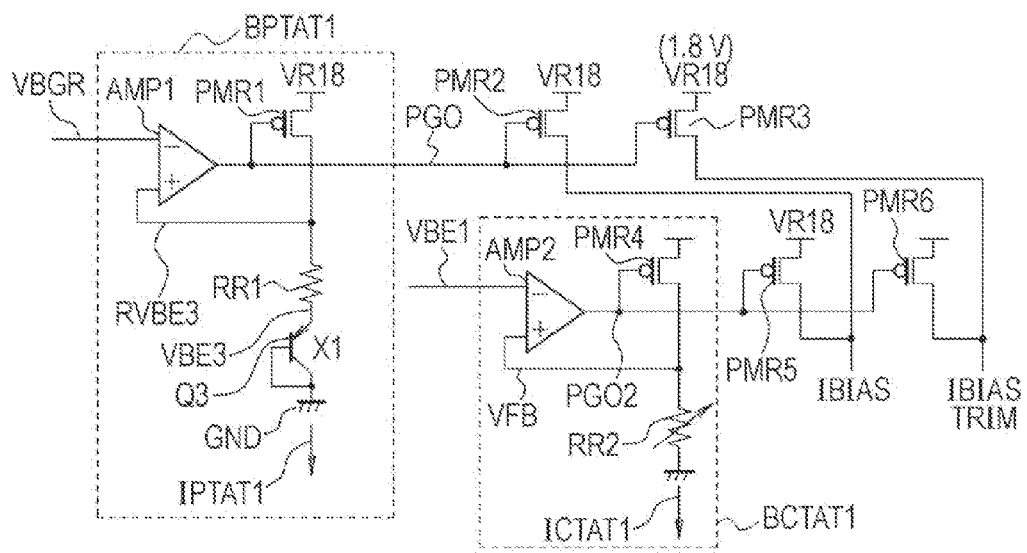
FIG. 8 is a circuit diagram illustrating an example of the configuration of the reference current generation circuit illustrated in FIG. 7.

FIG. 8 is a circuit diagram illustrating an example of the configuration of the reference current generation circuit IREF1 illustrated in FIG. 7. PMRn (n is an integer) denotes a P-channel MOS transistor, AMP1 and AMP2 each denote an amplifier circuit (operational amplifier), RR1 denotes a resistor, RR2 denotes a variable resistor, and Q3 denotes a PNP transistor. BPTAT1 denotes a PTAT current generation circuit, BCTAT1 denotes a CTAT current generation circuit, VBGR generates a band gap voltage generated by the band gap circuit BGR1 illustrated in FIG. 6, and PGO is a bias voltage generated by the PTAT current generation circuit BPTAT1. IPTAT1 denotes a current flowing through the transistor Q3, RVBE3 denotes a node within the PTAT current generation circuit BPTAT1, VBE1 denotes a potential VBE1 generated by the band gap circuit BGR1 illustrated in FIG. 6, and PGO2 denotes a bias voltage generated by the CTAT current generation circuit BCTAT1. ICTAT1 denotes a current flowing through the variable resistor RR2, VFB denotes a node within the CTAT current generation circuit BCTAT1, IBIAS and IBIASTRIM respectively denote the currents IBIAS and IBIASTRIM illustrated in FIG. 7, VR18 denotes a positive power supply potential (for example, 1.8 V) generated by the regulator REG1 illustrated in FIG. 5, and GND denotes a reference potential (ground potential: 0 V).

In FIG. 8, nodes or elements corresponding to those in the circuits illustrated in FIGS. 3, 5, and 6 are assigned the same symbols to indicate their correspondence. It is supposed that the number indicating a multiplication factor attached to the transistor Q3 in FIG. 8 indicates the relationship between the relative sizes of the transistors Q1, Q2, and Q3.

Since the band gap circuit BGR1 and the regulator REG1 illustrated in FIG. 5 are each a circuit that generates the power supply potential Vdd of 1.8 V from the power supply potential VDP5 of 5 V, its power supply potential may be the potential VDP5. On the other hand, since the CR oscillating circuit OSC1 is a circuit for supplying the clock signal CLK1 to the logic circuit LOGIC1 that operates at the power supply potential Vdd, its power supply potential may be the potential Vdd. When the potential Vdd is taken as the power supply potential, since the potential Vdd is a potential generated by the regulator REG1, there is an advantage in that the range of fluctuation of the power supply potential Vdd is small. In portions where current is constant, it is advantageous from the viewpoint of noise to perform wiring in such a way as to minimize the influence of the power supply potential of the logic circuit LOGIC1. Thus, in FIG. 8, the potential VR18 is used as the power supply potential in the sense that the power supply potential may be wired separately from the potential Vdd.

As is apparent from the configuration illustrated in FIG. 3, the signal amplitude of the CR oscillating circuit main body OSCCORE1 illustrated in FIGS. 3 and 7 is kept substantially constant independent of temperature by the regulator REG1 (FIG. 5). To keep oscillation frequency constant, it is necessary to keep the charging/discharging current for the capacitance of the CR oscillating circuit main body OSCCORE1 constant irrespective of temperature and the power supply potential VDP5. For this purpose, a constant current that is independent of temperature is generated by the circuit illustrated in FIG. 8.

The principle for generating a constant current that is independent of temperature is substantially the same as that for the band gap circuit BGR1. The current IPTAT1 that is positively proportional to absolute temperature and the current ICTAT1 that has a negative dependence on absolute temperature are summed to generate each of the currents IBIAS and IBIASTRIM that are substantially independent of temperature.

The PTAT current generation circuit BPTAT1 generates the current IPTAT1 that is positively proportional to absolute temperature, and the CTAT current generation circuit BCTAT1 generates the current ICTAT1 that has a negative dependence on absolute temperature. A current that is positively proportional to absolute temperature flows through each of transistors PMR2 and PMR3 whose gate voltage PGO is the same as that of a transistor PMR1. A current that has a negative dependence on absolute temperature flows through each of transistors PMR5 and PMR6 whose gate voltage PGO2 is the same as that of a transistor PMR4. Since the currents IBIAS and IBIASTRIM are each the sum of the current in the transistor PMR2, PMR3 and the current in the transistor PMR5, PMR6, the reference currents IBIAS and IBIASTRIM become independent of temperature.

Next, the principle for generating the current PTAT1 that is positively proportional to absolute temperature by the PTAT current generation circuit BPTAT1 will be described. A forward voltage VBE3 on the PNP transistor Q3 exhibits a substantially negative proportionality to absolute temperature. For example, the forward voltage VBE3 may be approximated by such a straight line that the voltage exhibits a value of about 1.2 V at absolute zero, and about 600 mV in the vicinity of room temperature. The band gap voltage VBGR generated by the band gap circuit BGR1 illustrated in FIG. 6 becomes a constant value at about 1.2 V independent of temperature. By performing feedback control by the amplifier circuit AMP1 so that the band gap voltage VBGR and the voltage of the node RVBE3 coincide with each other, the voltage of the node RVBE3 becomes the same as the band gap voltage VBGR, and is constant at about 1.2 V independent of temperature. Incidentally, since the voltage VBE3 exhibits a substantially negative proportionality to absolute temperature, the voltage applied to the resistor RR1 is positively proportional to absolute temperature. Since the voltage applied to the resistor RR1 is proportional to absolute temperature, the current IPTAT1 flowing through the resistor RR1 becomes proportional to absolute temperature. Since the current flowing through the transistor PMR1 is the current IPTAT1, like the current IPTAT1, the current flowing through each of the transistors PMR1, PMR2, and PMR3 whose gate voltage is the voltage PGO is also proportional to absolute temperature.

On the other hand, like the voltage VBE3, the potential VBE1 supplied from the band gap circuit BGR1 illustrated in FIG. 6 exhibits a substantially negative proportionality to absolute temperature. By performing feedback control by the amplifier circuit AMP2 so that the potential VBE1 and the potential of the node VFB coincide with each other, the potential of the node VFB becomes the same as the potential VBE1, and exhibits a substantially negative proportionality to absolute temperature. The potential applied to the variable resistor RR2 exhibits a substantially negative proportionality to absolute temperature. Since the voltage applied to the variable resistor RR2 exhibits a negative proportionality to absolute temperature, the current ICTAT1 flowing through the variable resistor RR2 becomes negatively proportional to absolute temperature. Since the current flowing through the transistor PMR4 is the current ICTAT1, like the current ICTAT1, the current flowing through each of the transistors PMR4, PMR5, and PMR6 whose gate voltage is the voltage PGO2 is also negatively proportional to absolute temperature. The resistor RR2 is formed as a variable transistor in order to make the value of the current ICTAT1 variable. The circuit of this portion will be described later in further detail.

The reference currents IBIAS and IBIASTRIM may be made independent of temperature by summing the currents flowing through the transistors PMR2 and PMR5, and the currents flowing through the transistors PMR3 and PMR6, respectively, at an appropriate ratio. By generating the reference currents IBIAS and IBIASTRIM that are independent of temperature in the circuit illustrated in FIG. 8, the number of PNP transistors may be advantageously reduced.

For example, in the band gap circuit BGR1 illustrated in FIG. 6, by using the transistors Q1 and Q2 of different sizes, these transistors are biased at different current densities, and the difference between their forward voltages is used in order to generate a PTAT current. For this reason, a PNP transistor with a size equivalent to 11 times the size of the transistor Q1 is used. On the other hand, in the circuit illustrated in FIG. 8, by keeping the potential of the resistor RR1 connected in series with the transistor Q3 constant irrespective of temperature, the PTAT current IPTAT1 is generated by a single transistor Q3 (a single PNP transistor) whose size is 1 time as large. That is, the use of the band gap voltage VBGR significantly reduces the area of PNP transistor necessary for generating the PTAT current IPTAT1.

The reference current generation circuit IREF1 has a positive dependence (PTAT) current generation circuit BPTAT1 that generates the positive dependence current IPTAT1 having a positive dependence on absolute temperature, and a negative dependence (CTAT) current generation circuit BCTAT1 that generates the negative dependence current ICTAT1 having a negative dependence on absolute temperature. The reference current generation circuit IREF1 generates each of the reference current IBIAS and IBIASTRIM by summing the positive dependence current IPTAT1 and the negative dependence current ICTAT1. A voltage corresponding to each of the reference currents IBIAS and IBIASTRIM is applied to each of the gates of the P-channel transistor PM5 and the N-channel transistor NM5.

The positive dependence current generation circuit BPTAT1 has the PNP transistor Q3 whose collector and base are each connected to the reference potential node, and the resistor RR1 whose one end is connected to the emitter of the PNP transistor Q3, and a first control circuit that controls the positive dependence current IPTAT1 flowing through the resistor RR1 in such a way that the potential of the node RVBE3 at the other end of the resistor RR1 and a first potential (band gap voltage) VBGR become equal to each other. The first control circuit has the amplifier circuit AMP1 and the transistor PMR1. The amplifier circuit AMP1 takes the band gap voltage VBGR of the band gap circuit BGR1 illustrated in FIG. 6 as input.

The negative dependence current generation circuit BCTAT1 has the resistor RR2 whose one end is connected to the reference potential node, and a second control circuit that controls the negative dependence current ICTAT1 flowing through the resistor RR2 in such a way that the potential of the node VFB at the other end of the resistor RR2 and a second potential VBE1 become equal to each other. The second control circuit has the amplifier circuit AMP2 and the transistor PMR4. The amplifier circuit AMP2 takes the emitter potential VBE1 of the PNP transistor Q1 of the band gap circuit BGR1 illustrated in FIG. 6 as input.

As described above, by using the reference current generation circuit IREF1 illustrated in FIG. 8, the element area may be advantageously reduced.

Figure 9:
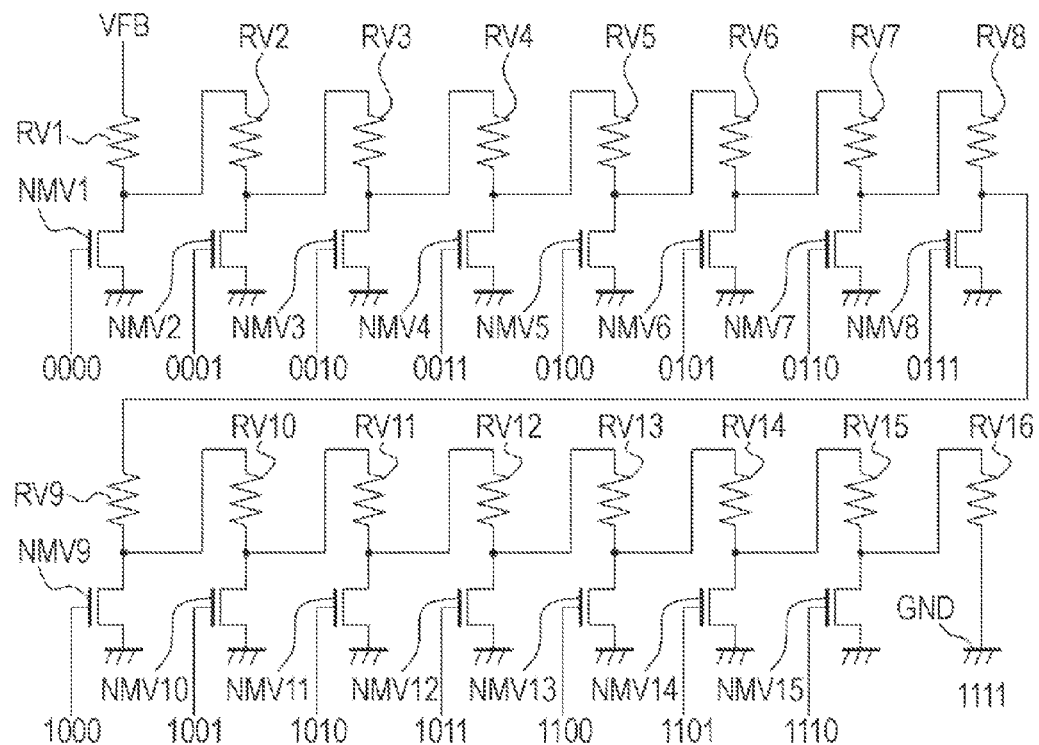
FIG. 9 is a circuit diagram illustrating an example of the configuration of the variable resistor illustrated in FIG. 8.

FIG. 9 is a circuit diagram illustrating an example of the configuration of the variable resistor RR2 illustrated in FIG. 8. NMVn (n is an integer) denotes an N-channel MOS transistor, RVn (n is an integer) denotes a resistor, VFB denotes the node VFB illustrated in FIG. 8, and GND denotes a reference potential (ground potential: 0 V).

In FIG. 9, nodes or elements corresponding to those in the circuit illustrated in FIG. 8 are assigned the same symbols to indicate their correspondence. The numbers from 0000 to 1110 attached to the respective gates of transistors NMV1 to NMV15 indicate an example of combination of the values of a 4-bit regulation signal TCA [3.0] with which the corresponding gates become high level, in the case when the variable resistor RP2 in FIG. 9 is controlled by the 4-bit regulation signal TCA [3:0] (FIG. 7). By means of the 4-bit regulation signal TCA [3:0], it is possible to select 16 different temperature dependences of reference current. To regulate the temperature dependence of reference current, the value of the current ICTAT1 is changed. To change the value of the current ICTAT1, the resistance of the variable resistor RR2 is changed. In the circuit illustrated in FIG. 9, the value of the variable resistor RR2 may be changed in accordance with the temperature dependence regulation signal TCA [3:0].

When the regulation signal TCA [3:0] is 0000, the transistor NMV1 turns ON, and the resistance (the value of the resistor RR2) between the node VFB and the node of the reference potential GND becomes the value of a resistor RV1. When the regulation signal TCA [3:0] is 1111, the transistors NMV1 to NMV15 all turn OFF, and the value of the variable resistor RR2 becomes the sum of the values of resistors RV1 to RV16. When the regulation signal TCA [3:0] is 0011, the transistors NMV1 to NMV3 turn OFF, and the transistor NMV4 turns OFF. The value of the variable resistor RR2 becomes the sum of the resistors RV1 to RV4.

In this way, the circuit illustrated in FIG. 9 may be used as the variable resistor RR2 illustrated in FIG. 8. By making the resistance of the variable resistor RR2 variable, it is possible to change the temperature dependence of the reference currents IBIAS and IBIASTRIM by, for example, the regulation signal TCA [3:0] illustrated in FIG. 7. Since the reference currents IBIAS and IBIASTRIM are each generated by the sum of the currents IPTAT1 and ICTAT1, by changing the value of the variable resistor RR2, the temperature dependence of the reference currents IBIAS and IBIASTRIM may be changed.

The reference current generation circuit IREF1 generates each of the reference currents IBIAS and IBIASTRIM by summing the positive dependence current IPTAT1 and the negative dependence current ICTAT1 while changing their summation ratio in accordance with the temperature dependence regulation signal TCA [3:0]. The resistor RR2 is a variable resistor whose resistance varies in accordance with the temperature dependence regulation signal TCA [3:0].

An error is present in the actual output potential VBGR of the reference voltage generation circuit generated in FIG. 6. This error also causes the temperature dependence of the band gap voltage VBGR to become slightly positive or negative depending on each individual circuit manufactured. For this reason, the values of the potentials Vdd and VR18 generated by the regulator REG1 illustrated in FIG. 5 also become slightly positive or negative depending on each individual circuit manufactured.

For this reason, even if the reference currents IBIAS and IBIASTRIM generated by the circuit illustrated in FIG. 8 are perfectly ideal, the temperature dependence of oscillation frequency differs slightly for each individual circuit. Further, the temperature dependence of the reference currents IBIAS and IBIASTRIM generated by the circuit illustrated in FIG. 8 itself also differs for each individual circuit. For this reason, to attain a desirable temperature dependence of oscillation frequency, it is necessary to regulate the temperature dependence for each individual circuit. By configuring the variable resistor RR2 of the reference current generation circuit in FIG. 8 as illustrated in FIG. 9, the temperature dependence of the reference currents IBIAS and IBIASTRIM in FIG. 8 may be made electrically variable.

Thus, it is possible to regulate the temperature dependence of oscillation frequency for each individual circuit, thereby enabling setting of frequency with higher accuracy.

Figure 10:
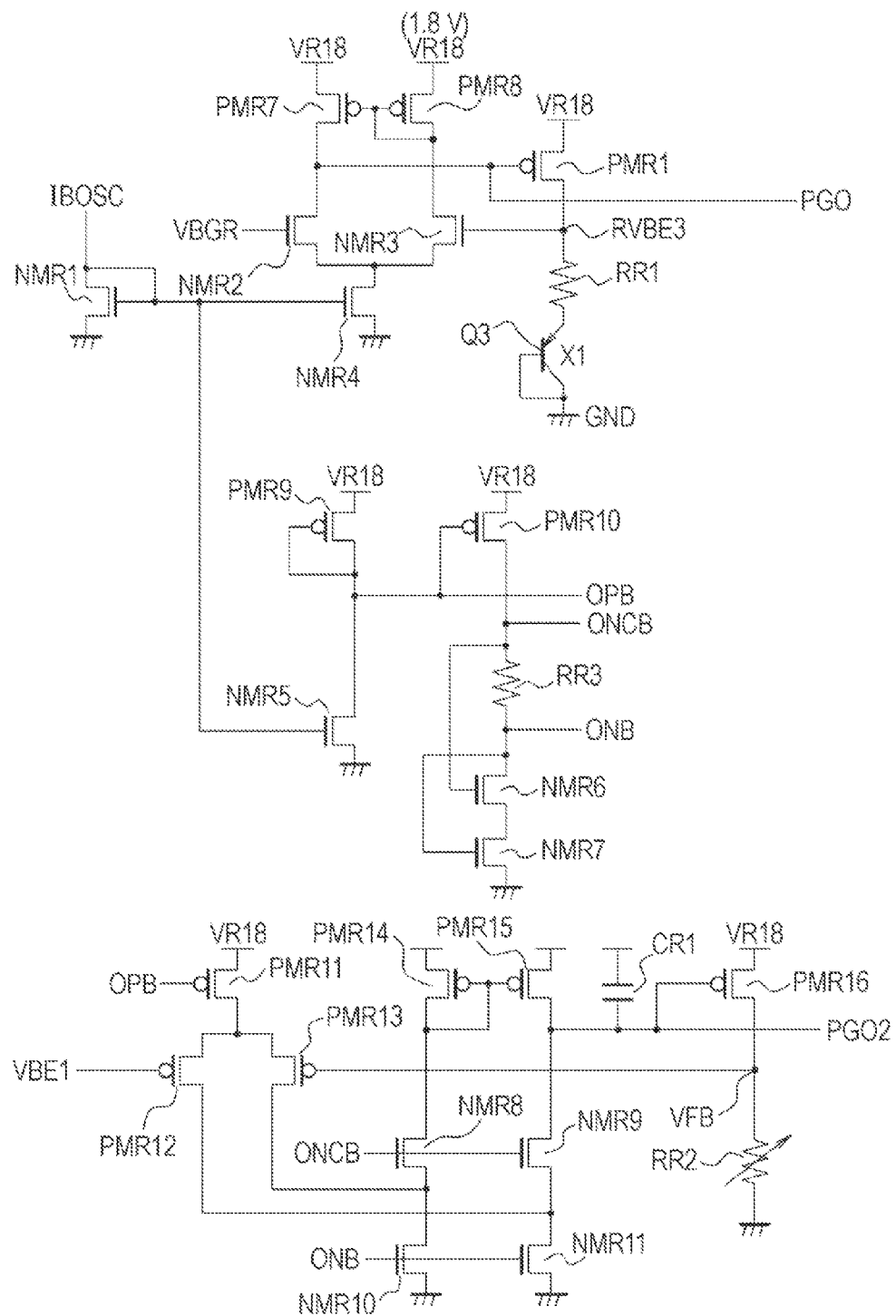
FIG. 10 is a circuit diagram illustrating an example of the configuration of each of the amplifier circuits illustrated in FIG. 8 and of the circuit in its vicinity.

FIG. 10 is a circuit diagram illustrating an example of the configuration of each of the amplifier circuits AMP1 and AMP2 illustrated in FIG. 8 and of the circuit in its vicinity. PMRn (n is an integer) denotes a P-channel MOS transistor, NMRn (n is an integer) denotes an N-channel MOS transistor, RR1 and RR3 each denote a resistor, RR2 denotes a variable resistor, and Q3 denotes a PNP transistor. VBGR denotes a bang gap voltage generated by the band gap circuit BGR1 illustrated in FIG. 6, PGO denotes a generated bias voltage, RVBE3 denotes an internal node, and VBE1 denotes a potential VBE1 generated by the band gap circuit BGR1 illustrated in FIG. 6. PGO2 denotes a generated bias voltage, VFB denotes an internal node, VR18 denotes a positive power supply voltage (for example, 1.8 V) generated by the regulator REG1 illustrated in FIG. 5, and GND denotes a reference potential (ground potential: 0 V). IBOSC denotes a bias current IBOSC supplied from the band gap circuit BGR1 illustrated in FIG. 6, OPB, ONCB, and ONB each denote a bias potential generated from the current IBOSC, and CR1 denotes a capacitor.

In FIG. 10, nodes or elements corresponding to those in the circuits illustrated in FIGS. 3, 5, 6, 8, and the like are assigned the same symbols to indicate their correspondence. It is supposed that the number indicating a multiplication factor attached to the transistor Q3 in FIG. 10 indicates the relationship between the relative sizes of the transistors Q1, Q2, and Q3. It is supposed that FIG. 10 represents an example of the transistor-level circuit of each of the amplifier circuits AMP1 and AMP2 illustrated in FIG. 8, although a part of the circuit such as the transistors PMR2, PMR3, and the like illustrated in FIG. 8 is omitted.

Transistors PMR7, PMR8, NMR2, NMR3, and NMR4 illustrated in FIG. 10 function as the amplifier circuit AMP1 illustrated in FIG. 8. Since this is a general differential circuit, description of the operation of this portion is omitted. The differential circuit according to this example is such that since the band gap voltage VBGR is 1.2 V, and the power supply potential VR18 is 1.8 V, the N-channel MOS transistors NMR2 and NMR3 are input transistors. In this regard, it is possible to modify the differential circuit so that P-channel MOS transistors are input transistors if the reference potential VBGR is closer to the reference potential GND.

In order for the transistors PMR7, PMR8, NMR2, NMR3, and NMR4 to operate, the gate voltage of the transistor NMR4 may be so biased that a predetermined current flows. For this purpose, the bias current IBOSC is received from the band gap circuit BGR1 illustrated in FIG. 6, and converted by the transistor NMR1 into a gate voltage for the transistor NMR4.

This configuration eliminates the need to provide an independent bias circuit on the amplifier circuit AMP1 side, thereby making it advantageously possible to save circuit area.

Transistors PMR11 to PMR15 and transistors NMR8 to NMR11 illustrated in FIG. 10 function as the amplifier circuit AMP2 illustrated in FIG. 8. The capacitor CR1 functions as a phase compensation capacitor. Since the amplifier circuits AMP1 and AMP2 are both used as feedback circuits, phase compensation is performed. Since the amplifier circuit AMP2 illustrated in FIG. 10 is a general folded cascode circuit, description of the operation of this portion is omitted. A folded cascode circuit in which the P-channel MOS transistors PMR12 and PMR13 are input transistors is used because the potential VBE1 is close to the reference potential GND.

Like the amplifier circuit AMP1 illustrated in FIG. 10, the amplifier circuit AMP2 illustrated in FIG. 10 also needs to be supplied with a bias potential. For example, as illustrated in FIG. 10, it is possible to generate the potentials OPB, ONB, and ONCB on the basis of the current IBOSC, and by supplying the bias current IBOSC from the circuit illustrated in FIG. 6, circuit area may be reduced. The current IBOSC in FIG. 6 is provided for this purpose, and it is needless to mention that the currents IBLVDH and IBLVDL in FIG. 6 may be also used in the same manner.

Since the configuration of the portion of the circuit for generating the potentials OPB, ONB, and ONCB from the current IBOSC is also a general one, description of the operation of this portion is also omitted.

As described above, the amplifier circuits AMP1 and AMP2 may be implemented by the circuits as illustrated in FIG. 10, for example, and by supplying the bias current IBOSC from the circuit illustrated in FIG. 6, the number of elements for generating the bias current may be reduced.

Figure 11:
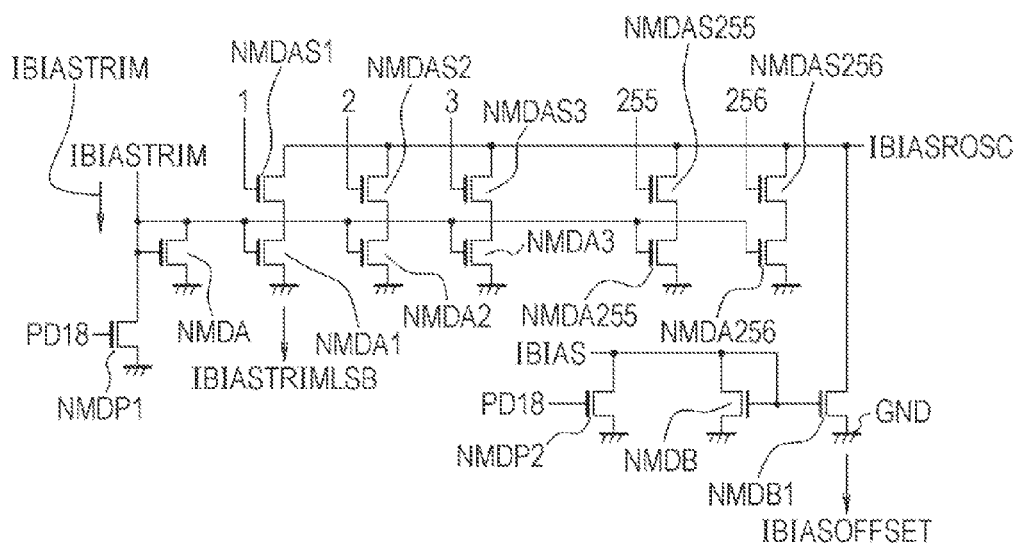
FIG. 11 is a circuit diagram illustrating an example of the configuration of the trimming current DAC circuit illustrated in FIG. 7.

FIG. 11 is a circuit diagram illustrating an example of the configuration of the trimming current DAC circuit IDAC1 illustrated in FIG. 7. NMDPn (n is an integer), NMDASn (n is an integer), NMDAn (n is an integer), NMDA, NMDB, and NMDB1 each denote an N-channel MOS transistor. IBIASTRIM denotes the current IBIASTRIM illustrated in FIG. 8, IBIAS denotes the current IBIAS illustrated in FIG. 8, PD18 denotes a power-down signal, and IBIASROSC denotes the bias current IBIASROSC illustrated in FIG. 3. GND denotes a reference potential (ground potential: 0 V), IBIASTRIMLSB denotes a current corresponding to 1 LSB (least significant bit) of the current DAC circuit IDAC1, and IBIASOFFSET denotes a current for an offset serving as the minimum current of the output current IBIASROSC. In FIG. 11, nodes or elements corresponding to those in the circuits illustrated in FIGS. 3, 5, 7, 8, and the like are assigned the same symbols to indicate their correspondence.

The circuit illustrated in FIG. 11 functions as a current DAC circuit for controlling the absolute value of the bias current IBIASROSC by the 8-bit signal TRD [7:0] as illustrated in FIG. 7. N-channel MOS transistors NMDAS1 to NMDAS256 indicate that, for example, 256 N-channel MOS transistors of the same size are provided. Likewise, N-channel MOS transistors NMDA1 to NMDA256 also indicate that 256 N-channel MOS transistors of the same size are provided.

The node of the current IBIASTRIM is connected to the node of the current IBIASTRIM illustrated in FIG. 8, and converts the bias current IBIASTRIM into a gate voltage by the transistor NMDA. This gate voltage is supplied to the transistors NMDA1 to NMDA256, so the same current may be made to flow through the transistors NMDA1 to NMDA256. The current IBIASTRIMLSB illustrated in FIG. 11 denotes a current that flows per one transistor NMDAn (n is 1 to 256). By appropriately designing the sizes of the transistor NMDA and transistors NMDA1 to NMDA256, the current IBIASTRIMLSB of a value may be obtained on the basis of the current IBIASTRIM. For example, the transistor NMDA and the transistors NMDA1 to NMDA256 are all in the same size, and the current IBIASTRIMLSB of 1 µA may be made to flow through each of the transistors.

The transistors NMDA1 to NMDA256 and the transistors NMDAS1 to NMDAS256 are respectively connected in series. By controlling the number of gates to be set to high level among the respective gates of the 256 transistors NMDAS1 to NMDAS256, the value of the bias current IBIASROSC supplied to the CR oscillating circuit main body OSCCORE1 illustrated in each of FIG. 3 and FIG. 7 may be controlled. Each of the numbers 1 to 256 attached to the respective gates of the transistors NMDAS1 to NMDAS256 means a control signal for the corresponding gate. Since 256 different bias currents IBIASROSC may be controlled by the 8-bit digital signal TRD [7:0] as illustrated in FIG. 7, for example, the value of the bias current IBIASROSC may be regulated by the current DAC circuit illustrated in FIG. 11.

The minimum value of the bias current IBIASROSC is, for example, one IBIASTRIMLSB+IBIASOFFSET in FIG. 11. This current may be designed so as to be the minimum current for frequency regulation of the CR oscillating circuit main body OSCCORE1 illustrated in FIG. 7. The current IBIASOFFSET may be designed to an arbitrary value by appropriately designing the size ratio between the transistors NMDB and NMDB1 on the basis of the current IBIAS in advance. Also, by setting the gate voltage PD18 of each of transistors NMDP1 and NMDP2 to high level, the gate voltage of each N-channel MOS transistor becomes 0, thus achieving a power-down state.

The current digital/analog conversion (DAC) circuit IDAC1 converts a digital signal TRD [7:0] into an analog bias current IBIASROSC by using the reference current IBIASTRIM. A voltage corresponding to the bias current IBIASROSC is applied to each of the gates of the P-channel transistor PM5 and N-channel transistor NM5 illustrated in FIG. 3.

As described above, a mechanism that makes the bias current IBIASROSC for frequency regulation variable may be implemented by the circuit as illustrated in FIG. 11, on the basis of the current IBIASTRIM generated by the reference current generation circuit IREF1 illustrated in FIG. 8.

Figure 12:
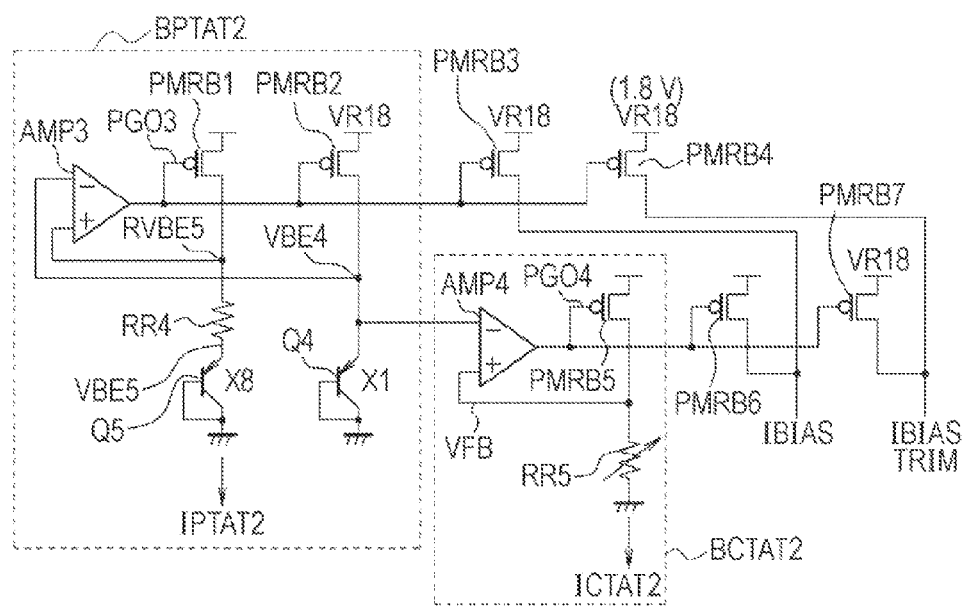
FIG. 12 is a circuit diagram illustrating another example of the configuration of the reference current generation circuit illustrated in FIG. 7.

FIG. 12 is a circuit diagram illustrating another example of the configuration of the reference current generation circuit IREF1 illustrated in FIG. 7. PMRBn (n is an integer) denotes a P-channel MOS transistor, AMP3 and AMP4 each denote an amplifier circuit (operational amplifier), RR4 denotes a resistor, RR5 denotes a variable resistor, and Q4 and Q5 each denote a PNP transistor. BPTAT2 denotes a PTAT current generation circuit, BCTAT2 denotes a CTAT current generation circuit, PGO3 denotes a bias potential generated by the PTAT current generation circuit BPTAT2, and IPTAT2 denotes a current flowing through the transistor Q5. RVBE5 and VBE4 each denote a node within the PTAT current generation circuit BPTAT2, PGO4 denotes a bias potential generated by the CTAT current generation circuit BCTAT2, and ICTAT2 denotes a current flowing through the variable resistor RR5. VFB denotes a node within the CTAT current generation circuit BCTAT2, IBIAS and IBIASTRIM respectively denote the currents IBIAS and IBIASTRIM illustrated in FIG. 7, VR18 denotes a positive power supply voltage (for example, 1.8 V) generated by the regulator REG1 illustrated in FIG. 5, and GND denotes a reference potential (ground potential: 0 V). In FIG. 12, nodes or elements corresponding to those in FIG. 8 and the like are assigned the same symbols to indicate their correspondence, and thus repetitive description is omitted.

Herein below, the difference between the circuit illustrated in FIG. 12 and the circuit illustrated in FIG. 8 will be described. In FIG. 12 as well, the PTAT current IPTAT2 is generated by the PTAT current generation circuit BPTAT2, and the CTAT current ICTAT2 is generated by the CTAT current generation circuit BCTAT2. These currents IPTAT2 and ICTAT2 are summed to generate each of the currents IBIAS and IBIASTRIM. The circuit illustrated in FIG. 12 is also the same as the circuit illustrated in FIG. 8 in that by changing the resistance of the variable resistor RR5, the value of the CTAT current ICTAT2 may be changed, thereby making it possible to regulate the temperature dependence of reference current.

In the circuit illustrated in FIG. 8, the band gap voltage VBGR and the potential VBE1 are supplied from the band gap circuit BGR1 illustrated in FIG. 6, and the PTAT current IPTAT1 and the CTAT current ICTAT1 are generated on the basis of these. By using the potentials VGBR and VBE1 from the band gap circuit BGR1, the number of elements for generating a reference current is reduced.

On the other hand, in FIG. 12, the PTAT current IPTAT2 and the CTAT current ICTAT2 are generated only within the reference current generation circuit IREF1 on the basis of the transistors Q4 and Q5. Although the number of elements increases, the configuration as illustrated in FIG. 12 is also possible. When arranging these circuits in a location far from the band gap circuit BGR1 of the regulator REG1, it is also possible to adopt the reference current generation circuit IREF1 as illustrated in FIG. 12.

The circuit illustrated in FIG. 12 is the same as the band gap circuit BGR1 illustrated in FIG. 6 in that the PTAT current IPTAT2 that is proportional to absolute temperature may be generated by controlling the potential of the node RVBE5 and the potential of the node VBE4 so as to coincide with each other, and appropriately designing the ratio between the current densities of the transistors Q4 and Q5. The circuit illustrated in FIG. 12 is also the same as the circuit illustrated in FIG. 8 in that the CTAT current ICTAT2 may be generated by generating current on the basis of the voltage of the node VBE4 which is the forward voltage of the PNP transistor Q4.

When the circuit illustrated in FIG. 12 is adopted, although the advantage of area reduction as in the case of the circuit illustrated in FIG. 8 is not obtained, the advantages described with reference to FIG. 7, such as enabling regulation of the temperature dependence of reference current, and enabling regulation of oscillation frequency, may be obtained.

Figure 13:
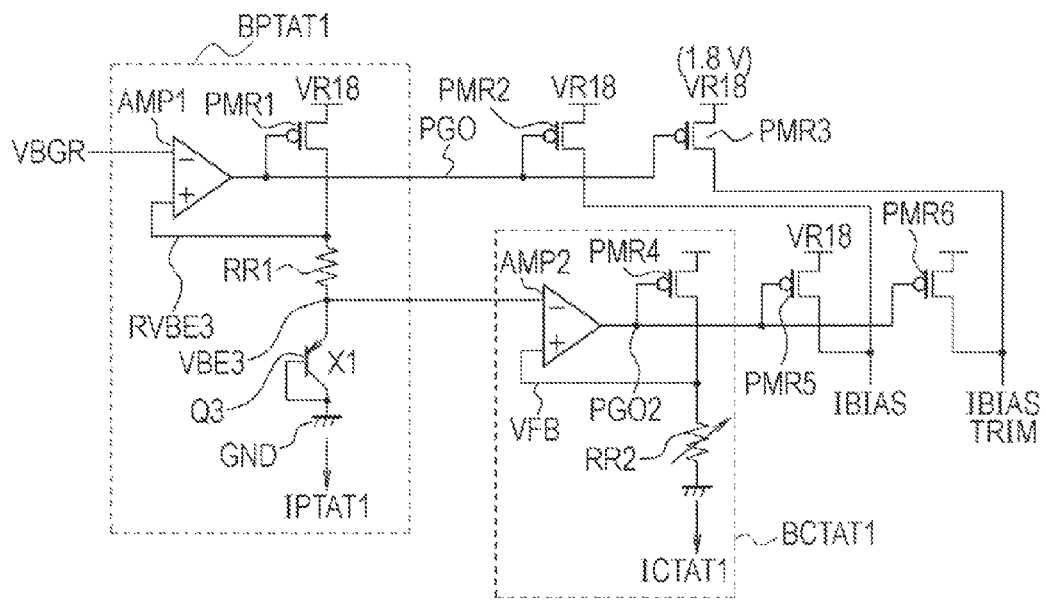
FIG. 13 is a circuit diagram illustrating another example of the configuration of the reference current generation circuit illustrated in FIG. 7.

FIG. 13 is a circuit diagram illustrating another example of the configuration of the reference current generation circuit IREF1 illustrated in FIG. 7. Since the only difference between the circuit illustrated in FIG. 13 and the circuit illustrated in FIG. 8 is the negative input of the amplifier circuit AMP2, only the difference in this respect will be described. The names of circuit elements, the names of nodes, and the like are also completely the same as those in FIG. 8, and thus repetitive description is omitted.

In the circuit illustrated in FIG. 8, the negative input of the amplifier circuit AMP2 is the voltage VBE1 of the band gap circuit BGR1 (FIG. 6). On the other hand, in the circuit illustrated in FIG. 13, the negative input of the amplifier circuit AMP2 is the voltage VBE3 of the PTAT current generation circuit BPTAT1. Since the PTAT current IPTAT1 flows through the transistor Q3 in FIG. 13 as well, the voltage VBE3 in FIG. 13 becomes substantially the same node voltage as the voltage VBE1 in FIG. 6, and its temperature characteristics also exhibit a negative proportionality to absolute temperature. Therefore, the connections as illustrated in FIG. 13 also make it possible to generate the reference currents IBIAS and IBIASTRIM in the same manner as in the circuit illustrated in FIG. 8.

When the connections as illustrated in FIG. 13 are adopted, only the band gap voltage VBGR and the current IBOSC suffice as the potential and bias current to be supplied to the reference current generation circuit IREF1 (FIG. 13) from the band gap circuit BGR1 illustrated in FIG. 6, thereby advantageously reducing the number of signal lines.

On the other hand, in the configuration illustrated in FIG. 8, the reference potential (the negative input of the amplifier circuit AMP2) VBE1 of the CTAT current generation circuit BCTAT1 is the potential VBE1 that is already stable, which provides an advantage in that the stabilization time for the reference current when starting the CR oscillating circuit may be shortened. In the circuit illustrated in FIG. 13, after the potential VBE3 of the PTAT current generation circuit BPTAT1 stabilizes, the potential of the node VFB stabilizes on the basis of this, so the time until the reference current stabilizes is longer than that in the case of the circuit illustrated in FIG. 8.

The amplifier circuit AMP1 takes the band gap voltage VBGR of the band gap circuit BGR1 illustrated in FIG. 6 as input, and controls the positive dependence current IPTAT1 flowing through the resistor RR1 in such a way that the band gap voltage VBGR and the potential of the node RVBE3 at the other end of the resistor RR1 become equal to each other. The amplifier circuit AMP2 controls the negative dependence current ICTAT1 flowing through the resistor RR2 in such a way that the emitter potential VBE3 of the PNP transistor Q3 and the potential of the node VFB at the other end of the resistor RR2 become equal to each other.

Figure 14:
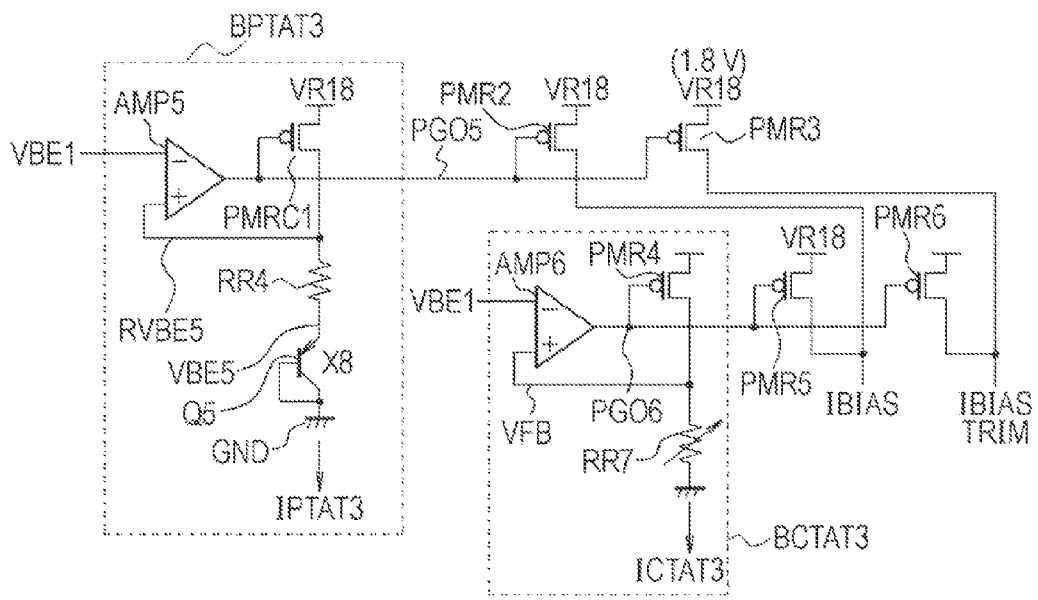
FIG. 14 is a circuit diagram illustrating another example of the configuration of the reference current generation circuit illustrated in FIG. 7.

FIG. 14 is a circuit diagram illustrating another example of the configuration of the reference current generation circuit IREF1 illustrated in FIG. 7. PMRCn (n is an integer) denotes a P-channel MOS transistor, AMP5 and AMP6 each denote an amplifier circuit (operational amplifier), RR4 denotes a resistor, RR7 denotes a variable resistor, and Q5 denotes a PNP transistor. BPTAT3 denotes a PTAT current generation circuit, BCTAT3 denotes a CTAT current generation circuit, PGO5 denotes a bias potential generated by the PTAT current generation circuit BPTAT3, and IPTAT3 denotes a current flowing through the transistor Q5. RVBE5 denotes a node within the PTAT current generation circuit BPTAT3, PGO6 denotes a bias potential generated by the CTAT current generation circuit BCTAT3, and ICTAT3 denotes a current flowing through the variable resistor RR7. VFB denotes a node within the CTAT current generation circuit BCTAT3, IBIAS and IBIASTRIM respectively denote the currents IBIAS and IBIASTRIM in FIG. 7, VR18 denotes a positive power supply potential (for example, 1.8 V) generated by a regulator REG1, GND denotes a reference potential (ground potential: 0 V), and VBE1 denotes the potential VBE1 generated in FIG. 6. In FIG. 14, nodes or elements corresponding to those in other drawings such as FIG. 8 are assigned the same symbol to indicate their correspondence, and thus repetitive description is omitted.

In FIG. 8, the current IPTAT1 that is proportional to absolute temperature is generated on the basis of the band gap voltage VBGR. On the other hand, in the circuit illustrated in FIG. 14, the PTAT current IPTAT3 is generated on the basis of the potential VBE1 of the band gap circuit BGR1.

In FIG. 12, the PTAT current IPTAT2 may be generated by controlling the potentials of the nodes RVBE5 and VBE4 so as to coincide with each other. Since the potential of the node VBE4 in FIG. 12 and the potential VBE1 in FIG. 6 are substantially equal, a PTAT current may be generated also by substituting the potential of the node VBE4 by the potential VBE1. In FIG. 14, the PTAT current IPTAT3 is generated by controlling the potential of the node RVBE5 and the potential VBE1 so as to coincide with each other by the amplifier circuit AMP5. Adopting the configuration as illustrated in FIG. 14 makes it possible to reduce the number of elements in comparison to the circuit illustrated in FIG. 12.

The amplifier circuit AMP5 takes the emitter potential VBE1 of the PNP transistor Q1 of the band gap circuit BGR1 illustrated in FIG. 6 as input, and controls the positive dependence current IPTAT3 flowing through the resistor RR4 in such a way that the emitter potential VBE1 and the potential of the node RVBE5 at the other end of the resistor RR4 become equal to each other. The amplifier circuit AMP6 takes the emitter potential VBE1 of the PNP transistor Q1 of the band gap circuit BGR1 illustrated in FIG. 6 as input, and controls the negative dependence current ICTAT3 flowing through the resistor RR7 in such a way that the emitter potential VBE1 and the potential of the node VFB at the other end of the resistor RR7 become equal to each other.

Figure 15:
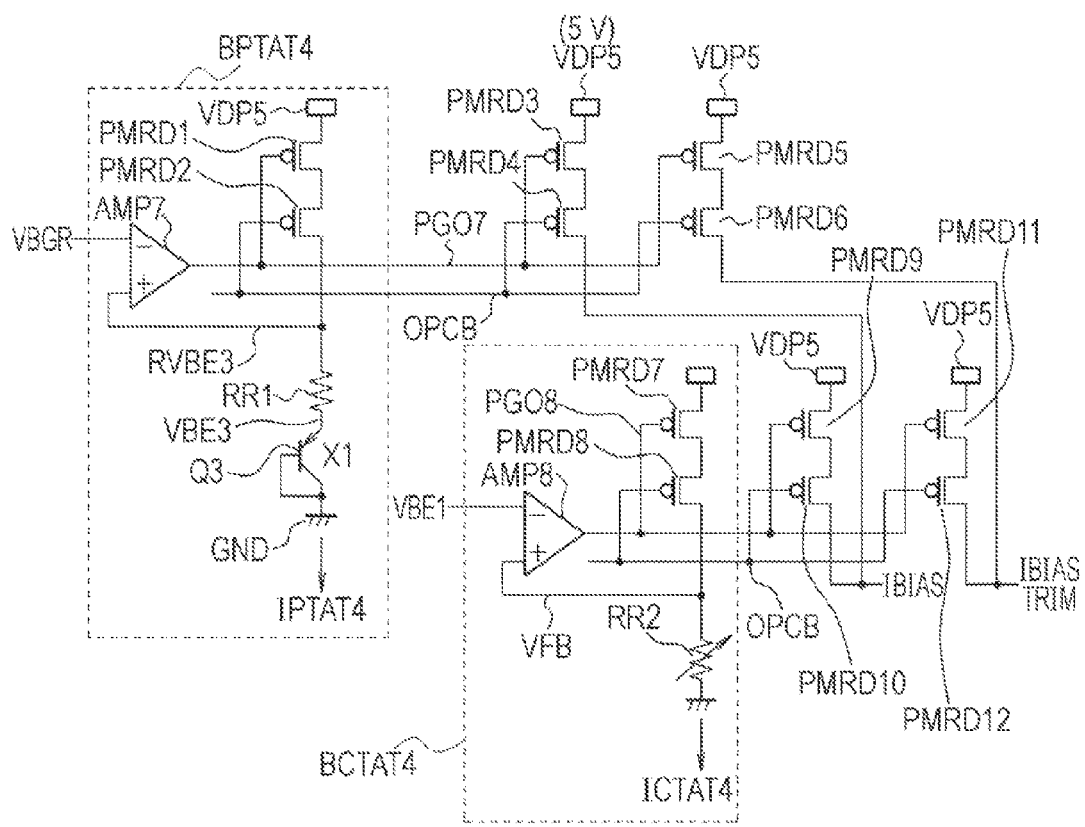
FIG. 15 is a circuit diagram illustrating another example of the configuration of the reference current generation circuit illustrated in FIG. 7.

FIG. 15 is a circuit diagram illustrating another example of the configuration of the reference current generation circuit IREF1 illustrated in FIG. 7. PMRDn (n is an integer) denotes a P-channel MOS transistor, AMP7 and AMP8 each denote an amplifier circuit (operational amplifier), RR1 denotes a resistor, RR2 denotes a variable resistor, and Q3 denotes a PNP transistor. BPTAT4 denotes a PTAT current generation circuit, BCTAT4 denotes a CTAT current generation circuit, PGO7 denotes a bias potential generated by the PTAT current generation circuit BPTAT4, and IPTAT4 denotes a current flowing through the transistor Q3. RVBE3 denotes a node within the PTAT current generation circuit BPTAT4, PGO8 denotes a bias potential generated by the CTAT current generation circuit BCTAT4, ICTAT4 denotes a current flowing through the variable resistor RR2, and VFB denotes a node within the CTAT current generation circuit BCTAT4. IBIAS and IBIASTRIM respectively denote the currents IBIAS and IBIASTRIM illustrated in FIG. 7, VDP5 denotes a positive power supply voltage (for example, 5 V), GND denotes a reference potential (ground potential: 0 V), VBE1 and VBGR respectively denote the potentials VBE1 and VBGR generated in FIG. 6, and OPCB denotes a bias potential for a cascode circuit. In FIG. 15, nodes or elements corresponding to those in other drawings such as FIG. 8 are assigned the same symbol to indicate their correspondence, and thus repetitive description is omitted.

The configuration illustrated in FIG. 15 is such that the power supply potential VR18 in the circuit illustrated in FIG. 8 is substituted by the power supply potential VDP5, and the current source is a cascode circuit. Since the basic operation principle is the same as that of the circuit illustrated in FIG. 8, detailed description of operation is omitted.

In the circuit illustrated in FIG. 8, the PTAT current IPTAT1 is generated on the basis of the band gap voltage VBGR, and the positive-side power supply potential of its current source is the potential VR18. The circuit may be operated also when this power supply potential VR18 is changed to the power supply potential VDP5, and FIG. 15 illustrates such an example. The current source is a cascode circuit because there are cases when the drain voltages of current sources PMRD3, PMRD4, and the like are large and also the power supply potential VDP5 fluctuates greatly. The bias potential OPCB serves as a bias potential for this purpose. The bias potential OPCB may be generated by the method as illustrated in FIG. 10. It is possible to adopt the configuration as illustrated in FIG. 15 in cases where the absolute value of the power supply potential VR18 or power supply potential Vdd is small, and it is more desirable to generate a reference current by using the power supply potential VDP5. While FIG. 15 illustrates an example in which the power supply potential in the circuit illustrated in FIG. 8 is substituted by the potential VDP5, it is needless to mention that in the case of other circuit examples as well, if it is necessary to substitute the power supply potential VR18 by the power supply potential VDP5, the current source may be configured as a cascode circuit.

As described above, as illustrated in FIG. 3, the CR oscillating circuit according to this embodiment employs the inverter PM4, NM4 in FIG. 3 and the CMOS transfer gate (transistor) PM5, NM5 connected in series to its output, as means for controlling the charging/discharging current for a load to be constant. The capacitor C2 is provided to ensure a design such that the signal amplitude of the node ND4 to be charged/discharged at constant current is smaller than the power supply potential Vdd. Also, as illustrated in FIG. 7, in the CR oscillating circuit, the signal TCA [3:0] is provided to regulate the temperature dependence of the reference current of the oscillating circuit from positive to negative. Also, as illustrated in FIG. 5, in the micro-controller MCU1, the band gap circuit BGR1, and the error amplifier EAMP1 and the regulator output transistor PMO1 that constitute the regulator REG1 are provided. The internal voltage Vdd (for example, 1.8 V) is generated by using the output band gap voltage VBGR of the band gap circuit BGR1. This internal voltage Vdd (for example, 1.8 V) is supplied to the CR oscillating circuit OSC1. Also, as illustrated in FIG. 5, the band gap circuit BGR1 supplies the band gap voltage VBGR to the low voltage detection circuits LVDH1 and LVDL1. Also, the reference current generation circuit IREF1 illustrated in FIG. 8 generates the bias currents IBIAS and IBIASTRIM for the CR oscillating circuit OSC1 on the basis of the band gap voltage VBGR.

As illustrated in FIG. 3, the CR oscillating circuit employs the inverter PM4, NM4, and the CMOS transfer gate (transistor) PM5, NM5 connected in series to its output, and the capacitor C2 is provided to ensure a design such that the signal amplitude of the node ND4 to be charged/discharged at constant current is smaller than the power supply potential Vdd. Therefore, when switching from charging to discharging or from discharging to charging of a load, it is unnecessary to charge/discharge a parasitic capacitance for ON/OFF of the MOS transistor by the current supplied to the load itself, thereby making it possible to suppress the influence of the parasitic capacitance on the current supplied to the load.

Also, as illustrated in FIG. 7, by providing the signal TCA [3:0] for regulating the temperature dependence of the reference currents IBIAS and IBIASTRIM of the CR oscillating circuit from positive to negative, it is possible to regulate the temperature dependence of the oscillation frequency of the oscillating circuit for each individual circuit manufactured, thereby enabling an improvement in the accuracy of the oscillation frequency.

Also, as illustrated in FIG. 5, the band gap circuit BGR1, and the error amplifier EAMP1 and the regulator output transistor PMO1 that constitute the regulator REG1 are provided, the internal voltage Vdd (for example, 1.8 V) is generated by using the output band gap voltage VBGR of the band gap circuit BGR1, the bias current IBIASROSC for the CR oscillating circuit OSC1 is generated on the basis of the band gap voltage VBGR, the band gap voltage VBGR is supplied to each of the low voltage detection circuits LVDH1 and LVDL1. Therefore, the band gap circuit BGR1 may be shared by the regulator REG1, the low voltage detection circuits LVDH1 and LVDL1, and the CR oscillating circuit OSC1, thereby enabling a reduction in circuit area as compared with a case where a band gap circuit is provided in each of these circuits.

According to this embodiment, fluctuation of oscillation frequency due to temperature variation of resistance may be prevented. Also, it is possible to prevent the parasitic capacitance at the drain of a transistor from introducing an error in the setting of current. In addition, it is possible to prevent a situation where the temperature dependence of reference voltage or the temperature dependence of reference current differs slightly for each individual circuit, and thus the temperature dependence of oscillation frequency differs for each individual circuit, introducing a large error in oscillation frequency. Moreover, the micro-controller MCU1 may be mounted with another circuit such as the regulator circuit REG1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An oscillating apparatus comprising:
a band gap circuit including
    a first PNP transistor having a base and a collector coupled to a reference potential node respectively,
    a second PNP transistor having a base and a collector coupled to the reference potential node respectively, and
    a first resistor coupled to an emitter of the second PNP transistor at one end, wherein
    the band gap circuit generates a band gap voltage by controlling a potential at the other end of the first resistor so that it becomes equal to an emitter potential of the first PNP transistor;
a transfer gate including a P-channel transistor and a N-channel transistor;
a reference current generation circuit that generates reference currents by summing a positive dependence current and a negative dependence current, the reference current generation circuit includes
    a positive dependence current generation circuit for generating a positive dependence current that has a positive dependence on absolute temperature, the positive dependence current generation circuit includes
        a third PNP transistor having a collector and a base coupled to the reference potential node respectively,
        a second resistor coupled to an emitter of the third PNP transistor at one end, and
        a first control circuit for controlling a positive dependence current flowing through the second resistor in such a way that a potential of the other end of the second resistor becomes equal to the band gap voltage, and
    a negative dependence current generation circuit for generating a negative dependence current that has a negative dependence on absolute temperature, the negative dependence current generation circuit includes
        a third resistor coupled to the reference potential node at one end, and
        a second control circuit for controlling a negative dependence current flowing through the third resistor in such a way that a potential of the other end of the third resistor becomes equal to the emitter potential of the first PNP transistor; and
a trimming current digital-to-analog conversion circuit that generates a bias current on the basis of the reference currents, wherein
a gate voltage corresponding to the bias current are applied to each of the gates of the P-channel transistor and the N-channel transistor, and
transfer gate outputs a signal at an input-terminal of the transfer gate from an output-terminal of the transfer gate in accordance with the gate voltage of each of the P-channel transistor and the N-channel transistor.

2. The oscillating apparatus according to claim 1, wherein the reference current generation circuit generates the reference currents by summing the positive dependence current and the negative dependence current while changing their summation ratio in accordance with a temperature dependence regulation signal.

3. The oscillating apparatus according to claim 1, wherein a value of the resistance of the third resistor changes in accordance with a temperature dependence regulation signal.

4. An oscillating apparatus comprising:
a band gap circuit including
    a first PNP transistor having a base and a collector coupled to a reference potential node respectively,
    a second PNP transistor having a base and a collector coupled to the reference potential node respectively, and
    a first resistor coupled to an emitter of the second PNP transistor at one end, wherein
    the band gap circuit generates a band gap voltage by controlling a potential at the other end of the first resistor so that it becomes equal to an emitter potential of the first PNP transistor;
a transfer gate including a P-channel transistor and a N-channel transistor;
a reference current generation circuit that generates reference currents by summing a positive dependence current and a negative dependence current, the reference current generation circuit includes
    a positive dependence current generation circuit for generating a positive dependence current that has a positive dependence on absolute temperature, the positive dependence current generation circuit includes
        a third PNP transistor having a collector and a base coupled to the reference potential node respectively,
        a fourth PNP transistor having a collector and a base coupled to the reference potential node respectively,
        a second resistor coupled to an emitter of the fourth PNP transistor at one end, and
        a first control circuit for controlling a positive dependence current flowing through the second resistor in such a way that a potential of the other end of the second resistor becomes equal to an emitter potential of the third PNP transistor, and
    a negative dependence current generation circuit for generating a negative dependence current that has a negative dependence on absolute temperature, the negative dependence current generation circuit includes
        a third resistor coupled to the reference potential node at one end, and
        a second control circuit for controlling a negative dependence current flowing through the third resistor in such a way that a potential of the other end of the third resistor becomes equal to the emitter potential of the third PNP transistor; and
a trimming current digital-to-analog conversion circuit that generates a bias current on the basis of the reference currents, wherein
a gate voltage corresponding to the bias current are applied to each of the gates of the P-channel transistor and the N-channel transistor, and
transfer gate outputs a signal at an input-terminal of the transfer gate from an output-terminal of the transfer gate in accordance with the gate voltage of each of the P-channel transistor and the N-channel transistor.

5. An oscillating apparatus comprising:
a band gap circuit including a first PNP transistor having a base and a collector coupled to a reference potential node respectively, a second PNP transistor having a base and a collector coupled to the reference potential node respectively, and a first resistor coupled to an emitter of the second PNP transistor at one end, wherein the band gap circuit generates a band gap voltage by controlling a potential at the other end of the first resistor so that it becomes equal to an emitter potential of the first PNP transistor;

a transfer gate including a P-channel transistor and a N-channel transistor;

a reference current generation circuit that generates reference currents by summing a positive dependence current and a negative dependence current, the reference current generation circuit includes a positive dependence current generation circuit for generating a positive dependence current that has a positive dependence on absolute temperature, the positive dependence current generation circuit includes a third PNP transistor having a collector and a base coupled to the reference potential node respectively, a second resistor coupled to an emitter of the third PNP transistor at one end, and a first control circuit for controlling a positive dependence current flowing through the second resistor in such a way that a potential of the other end of the second resistor becomes equal to the band gap voltage, and a negative dependence current generation circuit for generating a negative dependence current that has a negative dependence on absolute temperature, the negative dependence current generation circuit includes a third resistor coupled to the reference potential node at one end, and a second control circuit for controlling a negative dependence current flowing through the third resistor in such a way that a potential of the other end of the third resistor becomes equal to an emitter potential of the third PNP transistor; and a trimming current digital-to-analog conversion circuit that generates a bias current on the basis of the reference currents, wherein a gate voltage corresponding to the bias current are applied to each of the gates of the P-channel transistor and the N-channel transistor, and transfer gate outputs a signal at an input-terminal of the transfer gate from an output-terminal of the transfer gate in accordance with the gate voltage of each of the P-channel transistor and the N-channel transistor.

6. An oscillating apparatus comprising:
a band gap circuit including a first PNP transistor having a base and a collector coupled to a reference potential node respectively, a second PNP transistor having a base and a collector coupled to the reference potential node respectively, and a first resistor coupled to an emitter of the second PNP transistor at one end, wherein the band gap circuit generates a band gap voltage by controlling a potential at the other end of the first resistor so that it becomes equal to an emitter potential of the first PNP transistor;

a transfer gate including a P-channel transistor and a N-channel transistor;

a reference current generation circuit that generates reference currents by summing a positive dependence current and a negative dependence current, the reference current generation circuit includes a positive dependence current generation circuit for generating a positive dependence current that has a positive dependence on absolute temperature, the positive dependence current generation circuit includes a third PNP transistor having a collector and a base coupled to the reference potential node respectively, a second resistor coupled to an emitter of the third PNP transistor at one end, and a first control circuit for controlling a positive dependence current flowing through the second resistor in such a way that a potential of the other end of the second resistor becomes equal to the emitter potential of the first PNP transistor, and a negative dependence current generation circuit for generating a negative dependence current that has a negative dependence on absolute temperature, the negative dependence current generation circuit includes a third resistor coupled to the reference potential node at one end, and a second control circuit for controlling a negative dependence current flowing through the third resistor in such a way that a potential of the other end of the third resistor becomes equal to the emitter potential of the first PNP transistor; and a trimming current digital-to-analog conversion circuit that generates a bias current on the basis of the reference currents, wherein a gate voltage corresponding to the bias current are applied to each of the gates of the P-channel transistor and the N-channel transistor, and transfer gate outputs a signal at an input-terminal of the transfer gate from an output-terminal of the transfer gate in accordance with the gate voltage of each of the P-channel transistor and the N-channel transistor.

* * * * *